(12) United States Patent
Tsuneta et al.

(10) Patent No.: US 7,633,064 B2
(45) Date of Patent: Dec. 15, 2009

(54) ELECTRIC CHARGED PARTICLE BEAM MICROSCOPY AND ELECTRIC CHARGED PARTICLE BEAM MICROSCOPE

(75) Inventors: Ruriko Tsuneta, Fuchu (JP); Masanari Koguchi, Kunitachi (JP); Hiromi Inada, Pleasanton, CA (US)

(73) Assignee: Hitachi High-Technologies Corporation, Tokyo (JP)

( * ) Notice: Subject to any disclaimer, the term of this patent is extended or adjusted under 35 U.S.C. 154(b) by 332 days.

(21) Appl. No.: 11/773,840

(22) Filed: Jul. 5, 2007

(65) Prior Publication Data

US 2008/0093551 A1    Apr. 24, 2008

(30) Foreign Application Priority Data

Jul. 7, 2006  (JP) .............................. 2006-187385

(51) Int. Cl.
*H01J 37/153* (2006.01)
(52) U.S. Cl. ..................... 250/310; 250/307; 250/252.1
(58) Field of Classification Search .................. 250/310, 250/307, 252.1
See application file for complete search history.

(56) References Cited

U.S. PATENT DOCUMENTS

| | | | |
|---|---|---|---|
| 6,486,472 B2 | 11/2002 | Gunji et al. | |
| 6,509,564 B1 | 1/2003 | Suzuki et al. | |
| 6,570,157 B1 * | 5/2003 | Singh et al. | 250/310 |
| 7,361,941 B1 * | 4/2008 | Lorusso et al. | 257/100 |
| 7,372,051 B2 * | 5/2008 | Tsuneta et al. | 250/310 |
| 7,435,957 B2 * | 10/2008 | Inada et al. | 250/310 |
| 2006/0038125 A1 | 2/2006 | Tsuneta et al. | |

FOREIGN PATENT DOCUMENTS

| | | |
|---|---|---|
| JP | 2000-40481 | 2/2000 |
| JP | 2002-184336 | 6/2002 |
| JP | 2003-022773 | 1/2003 |
| JP | 2006-58210 | 3/2006 |

* cited by examiner

*Primary Examiner*—Jack I Berman
(74) *Attorney, Agent, or Firm*—Mattingly & Malur, PC

(57) ABSTRACT

An electric charged particle beam microscope measures a geometric distortion at an arbitrary magnification with high precision, and corrects the geometric distortion. A geometric distortion at a first magnification is measured as an absolute distortion based on a standard specimen having a cyclic structure. A microscopic structure specimen is photographed at a geometric distortion measured first magnification and at a geometric distortion unmeasured second magnification. The image at the first magnification is equally transformed to the second magnification to generate a scaled image. The geometric distortion at the second magnification is measured as a relative distortion based on the scaled image. The absolute distortion at the second magnification is obtained on the basis of the absolute distortion at the first magnification and the relative distortion at the second magnification. Subsequently, the second magnification is replaced with the first magnification, and the relative distortion measurement is repeated.

13 Claims, 18 Drawing Sheets

SMALL DOMAIN

REVISION SIGNAL OF
X-DIRECTION DEFLECTOR: Ix

REVISION SIGNAL OF
Y-DIRECTION DEFLECTOR: Iy

ELECTRIC CHARGED PARTICLE BEAM MICROSCOPY AND ELECTRIC CHARGED PARTICLE BEAM MICROSCOPE

CLAIM OF PRIORITY

The present application claims priority from Japanese application JP 2006-187385 filed on Jul. 7, 2006, the content of which is hereby incorporated by reference into this application.

FIELD OF THE INVENTION

The present invention relates to an electric charged particle beam device that measures the dimensions of a specimen, and an inspection device used for a pattern inspection of a semiconductor device.

BACKGROUND OF THE INVENTION

As a device for visualizing the configuration of a specimen with precision of nm (nanometer), there are a SEM (scanning electron microscope), a STEM (scanning transmission electron microscope), and a TEM (transmission electron microscope). The SEM and STEM are devices that raster-scans the specimen with an electron beam that has been converged to the order of nm, detects a signal that is generated from an electron beam irradiated area, and synchronizes the signal with raster scanning to form an image. The TEM is a device that irradiates parallel electron beams to the specimen, and enlarges and projects electrons that have been transmitted through the specimen on a camera or a fluorescence plate by an electromagnetic lens for observation. In recent years, with the miniaturization of the semiconductor device structure, there increase needs for the management of dimensions of several tens nm width which is conducted by the high-resolution SEM, and the management of dimensions of several nm width which is conducted by the STEM, that is, for the dimension management using an image of an intermediate or high magnification or a defect inspection in the middle or high magnification. In order to accurately obtain the dimension of the specimen or the configuration of a defect on the basis of the image that has been obtained by those devices, an accurate magnification of the image with respect to the specimen is required. JP-A 2006-058210 discloses a high-precision magnification correcting technique. In the technique, the magnification with respect to the specimen is corrected by using a standard specimen including a repetitive pattern having a known cycle. A first image obtained by actually measuring a magnification of the image with respect to the specimen is recorded by using a specimen having a microscopic structure, a second image whose magnification with respect to the specimen is unknown is recorded, and the magnification of the second image with respect to the first image is analyzed by the aid of an image analysis. The magnification of the second image with respect to the specimen is obtained on the basis of the magnification of the first image with respect to the specimen and the magnification of the second image with respect to the first image. Hereinafter, the above magnification analysis is repeated with the second image as the first image, to thereby measure the magnification in the entire magnification range.

It is assumed in JP-A 2006-058210 that the magnification within the image surface is uniform, and there is no geometric distortion. However, there actually exist diverse factors that geometrically distort the image. Specifically, there are the distortion that is attributable to a change in the height of the specimen or a change in the returning electric field as disclosed in JP-A 2000-040481, the distortion that is attributable to the distortion aberration as disclosed in JP-A 2002-184336, and the deflection distortion as disclosed in JP-A 2002-251975.

As a technique for measuring the above-mentioned geometric distortion, JP-A 2003-022773 discloses a technique by which a mark pattern having a two-dimensional cyclic structure of 200 nm cycle is used, electron beams are scanned with an angle with respect to the mark pattern to generate an interference pattern, and a geometric distortion is measured and corrected on the basis of the interference pattern. As the technique for correcting the geometric distortion, JP-A 2002-184336 discloses a technique by which the geometric distortion that is attributable to the change in the height of the specimen or the change in the returning electric field is measured by the aid of a standard mark, a correction data table is produced on the basis of the measured geometric distortion, and the electron beam scanning is controlled on the basis of the correction data table to correct the geometric distortion. Also, JP-A 2000-040481 discloses a technique by which the distortion that is attributable to the distortion aberration of an electronic optical lens is measured by means of a specimen having an orthogonal line that is about 5 µm to 0.5 µm in the line width, and corrected by a correction lens.

SUMMARY OF THE INVENTION

In the related art, an image of the standard specimen having the known structure is photographed, and the distortion of the standard specimen image is measured, to thereby measure the geometric distortion that is caused by a device. An error in the measured geometric distortion depends on an analysis error of the image processing and a dimensional error in the known structure. As the standard specimen used in the above related art, there are a low-magnification standard specimen having a cyclic structure that is several 100 nm in pitch, and a high-magnification standard specimen having an lattice image such as gold single crystal (0.102 nm) or mica single crystal (1.0 nm). The dimensional errors of those specimens are 1% or lower. However, an intermediate-magnification standard specimen, that is, a specimen that is several 10 nm to several nm in the pitches of the cyclic structure, and 1% or lower in the dimensional error does not exist up to now, and the dimensional error in the intermediate-magnification standard specimen is about 5%. It is impossible that the geometric distortion measurement error is made smaller than the dimensional error of the standard specimen. Accordingly, the geometric distortion cannot be measured with a high precision, and a high-precision image cannot be conducted, at the magnification where no high-precision standard specimen exists. Also, in conducting the defect inspection of the specimen, when a difference image is calculated by an image that is insufficiently corrected, that is, an image having the geometric distortion, the geometric distortion may be misidentified as a defect.

The present invention has been made under the above circumstances, and therefore an object of the present invention is to provide a technique of measuring and correcting a geometric distortion with high precision even at a magnification where there exists no high-precision standard specimen.

In the present invention, there are used an absolute-distortion measurement standard specimen having a cyclic structure of a known dimension, and a relative distortion measurement specimen having a microscopic structure. First, the absolute distortion at a first magnification is measured by the aid of the absolute-distortion measurement standard specimen having the cyclic structure. The images of the relative distortion measurement specimen having the microscopic structure are photographed at a first magnification and a second magnification. A scaled image that is obtained by isotropically transforming the image photographed at the first magnification to the second magnification is generated. The relative distortion of the second magnification with respect to the first magnification is measured by using the scaled image and the image that has been photographed at the second magnification. An absolute distortion of the second magnification is obtained on the basis of an absolute distortion of the first magnification and the relative distortion of the second magnification. Hereinafter, the second magnification is replaced with the first magnification, and the above step is repeated, thereby making it possible to obtain an absolute distortion at an arbitrary magnification. The absolute distortion at the arbitrary magnification is corrected on the basis of the obtained measured results.

According to the present invention, it is possible to measure the geometric distortion with high precision even at a magnification where the high-precision standard specimen does not exist, and correct the geometric distortion. For that reason, a length measurement precision is improved without any variation at the arbitrary magnification. Also, since the geometric distortion can be corrected with high precision, misidentification can be prevented even when the defect inspection of the specimen is conducted, to thereby improve the defect detection efficiency.

BRIEF DESCRIPTION OF THE DRAWINGS

These and other objects and advantages of this invention will become more fully apparent from the following detailed description taken with the accompanying drawings in which:

FIGS. 5A to 5C are schematic diagrams illustrating a specimen that is used for an absolute geometric distortion correction, in which FIG. 5A shows a one-dimensional cyclic structure, FIG. 5B shows a two-dimensional cyclic structure, and FIG. 5C shows a specimen having two types of one-dimensional cyclic structures;

DETAILED DESCRIPTION OF THE PREFERRED EMBODIMENTS

Now, a description will be given in more detail of preferred embodiments of the present invention with reference to the accompanying drawings.

First Embodiment

Figure 2:
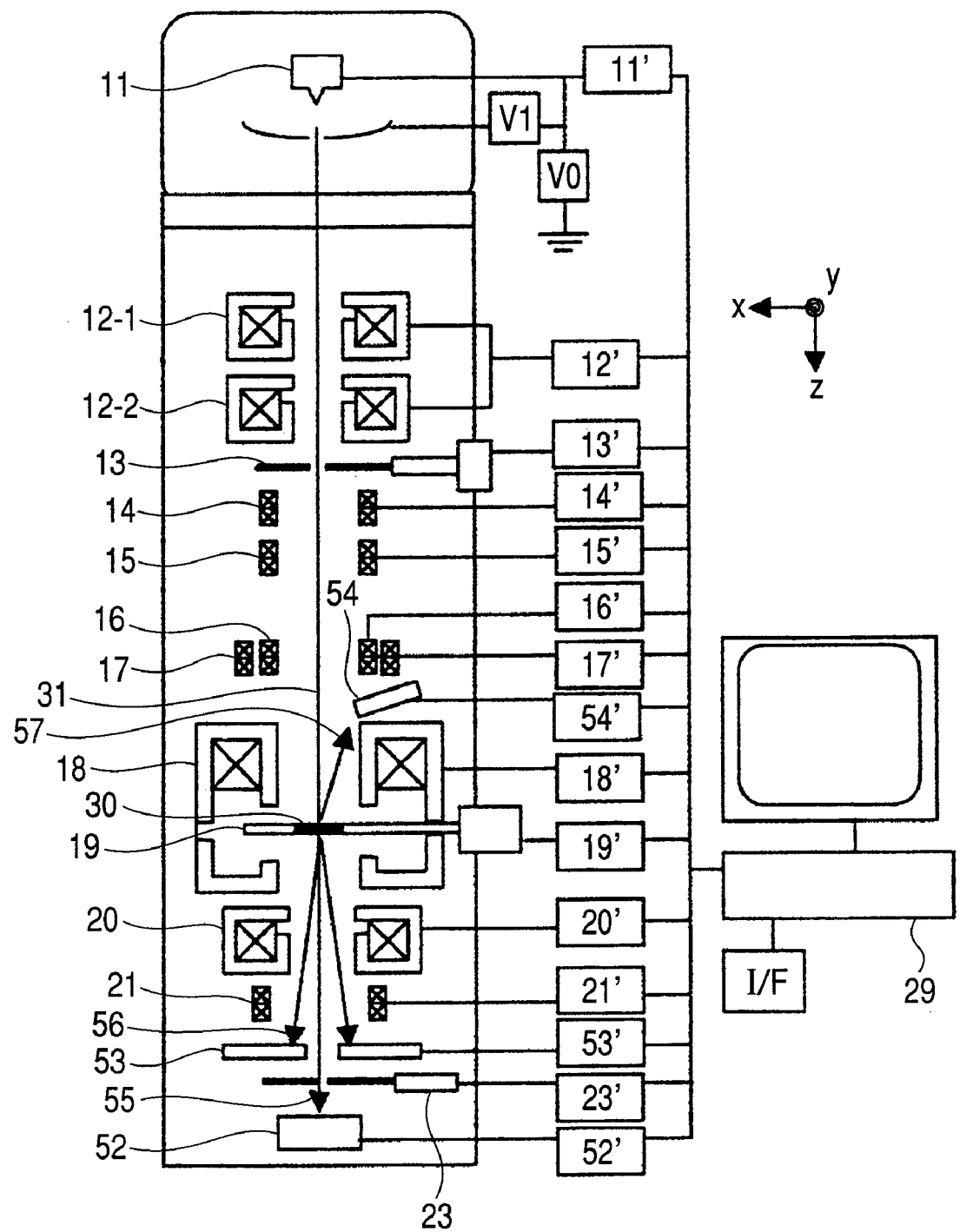
FIG. 2 is a diagram illustrating a basic structure of a STEM/SEM.

In this embodiment, a geometric distortion correcting technique is applied to a STEM/SEM. FIG. 2 shows a basic structural diagram of the STEM/SEM used in this embodiment. The STEM/SEM includes an electron gun 11 that generates a primary electron beam 31, an electron gun control unit 11' that controls an acceleration voltage and an extraction voltage of the primary electron beam 31, a condenser lens 12 that converges the primary electron beam 31, a condenser lens control unit 12' that controls a current value of the condenser lens 12, a condenser aperture 13 that controls the spread angle of the primary electron beam 31, a condenser aperture control unit 13' that controls a position of the condenser aperture 13. The STEM/SEM also includes an alignment deflector 14 that controls an incident angle with respect to a specimen 30, an alignment deflector control unit 14' that controls a current value of the alignment deflector 14, a stigmator 15 that corrects the beam configuration of the primary electron beam 31 which is input to the specimen 30, a stigmators control unit 15' that controls a current value of the stigmator 15, an image shift deflector 16 that adjusts the irradiated area of the primary electron beam 31 which is input to the specimen 30, an image shift deflector control unit 16' that controls a current of the image shift deflector 16, a scanning deflector 17 that raster-scans the specimen 30 with the primary electron beam 31 which is input to the specimen 30, and a scanning deflector control unit 17' that controls a current of the scanning deflector. The STEM/SEM further includes an objective lens 18 that adjusts a focal position of the primary electron beam 31 on the specimen 30, an objective lens control unit 18' that controls a current value of the objective lens 18, a specimen stage 19 that sets the position of the specimen 30, a specimen stage control unit 19' that controls a position of the specimen stage 19, electron detectors 22 that detect the electron beams 32 which are generated from the specimen 30, an electron detector control unit 22' that forms a STEM/SEM image according to a detected electron beam signal and a raster scanning signal, and a computer 29 that is equipped with control software and image processing software. The respective control units and an image forming unit are controlled on command by the computer 29. This device is equipped with the plural electron beam detectors 22, and includes a bright viewing field detector 52 that detects a low angle scattering electron beam among electron beams that are output in front of the specimen 30, a bright viewing field detector control unit 52' that controls the bright viewing field detector 52, a dark viewing field detector 53 that detects a high angle scattering electron beam, a dark viewing field detector control unit 53' that controls the dark viewing field detector 53, a detector 54 that detects reflective electrons and/or secondary electrons which are output in the rear of the specimen 30, and a detector control unit 54' that controls the detector 54. It is assumed that an image that is formed by electrons that are output in front of the specimen 30 is a STEM image, and an image that is formed by electrons that are output in the rear of the specimen 30 is a SEM image. Hereinafter, for simplification, only the STEM image will be described. The SEM image and the STEM image are different in the kind of detected electrons from each other, and the geometric distortion in the image is identical with each other.

First, a description will be given of a process of irradiating a specimen with an electron beam from an optical system to obtain a STEM image with reference to a device shown in FIG. 2. The primary electron beam 31 is extracted from the electron gun 11 by an extraction voltage V1, and an acceleration voltage V0 is applied to the primary electron beam 31. It is assumed that a direction that is substantially in parallel to the optical axis of a mirror body is a Z-direction, and a plane that is substantially orthogonal to the optical axis is an X-Y plane. A thinned specimen 30 is mounted on a specimen stage 19, and the primary electron beam 31 is input from a Z-direction. The specimen 30 is raster-scanned with the primary electron beam 31 that has been converged to the nm order by the aid of the condenser lens 12 by the aid of the scanning deflector 17. The electron beams 32 that are output from the specimen 30 upon input of the primary electron beam 31 are detected by the electron beam detectors 22. The detected electron beam signal and the raster scanning signals of the scanning deflector 17 are synchronized with each other to form a STEM image.

Figure 3:
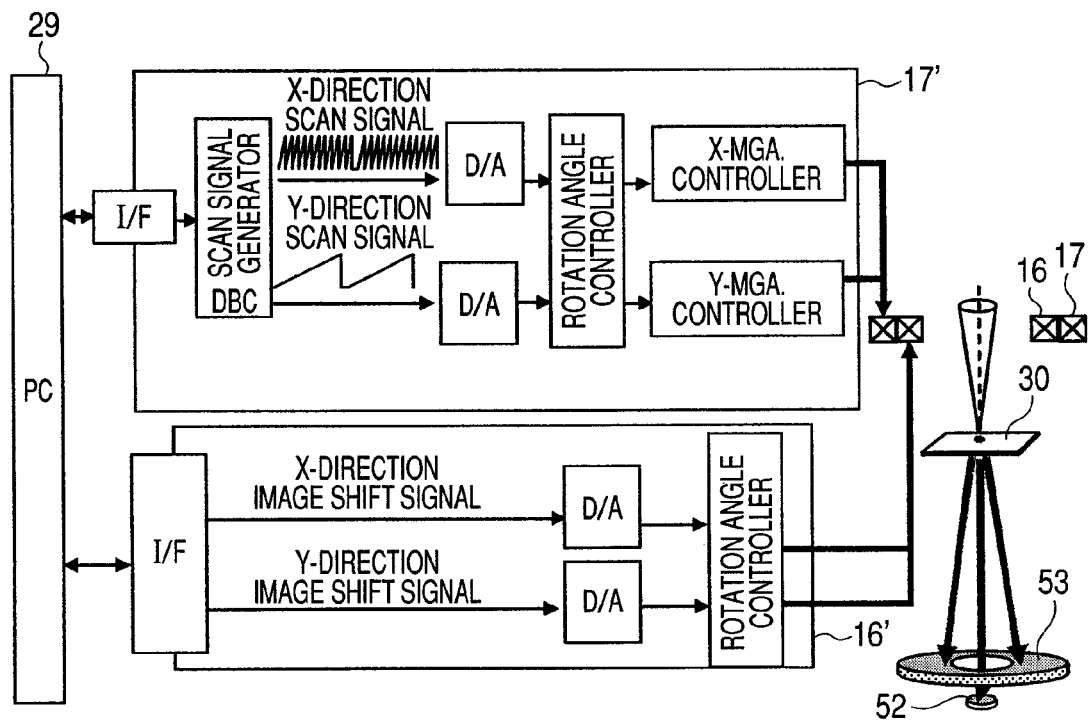
FIG. 3 is a diagram illustrating a basic structure of a conventional scanning deflector control section and a conventional image shift deflector control section.

FIG. 3 shows an example of the scanning deflector control unit 17' of the scanning deflector 17. The scanning of the electron beams are digitally controlled, and an X-scanning control value and a Y-scanning control value are allocated to each of pixels. In other words, there are provided an X-scanning control value table and a Y-scanning control value table. A waveform generation unit generates the X-scanning control signal and the Y-scanning control signal on the basis of the control value tables. After the X-scanning control signal and the Y-scanning control signal have been subjected to digital to analog (D/A) conversion, those control signals pass through a rotation angle setting unit that changes the scanning direction of electron beams, and then transmitted to a magnification setting unit that controls the scanning range of the electron beams, respectively. In the present application, a waveform distortion that is developed in an electronic circuit, and a geometric distortion that is attributable to the hysteresis of the deflector are called "scan distortion".

Also, FIG. 3 also shows the image shift deflector control unit 16' of the image shift deflector 16 that is used for collection of the geometric distortion which will be described later. The image shift deflector 16 is a deflector that is disposed for finely adjusting a visual field position, and is so designed as to operate with respect to an orbit of the primary electron beam 31 in the same manner as that of the scanning deflector 17. More specifically, the positions and the winding numbers of those deflectors are identical with each other, and a coil conductor is doubly winded so that one conductor is used for the image shift, and another conductor is used for the scanning signal. The control value corresponding to the viewing field displacement is transmitted to the image shift deflector 16 from the computer 29. After the transmitted control value has been subjected to D/A conversion, the converted control value is converted by the rotation angle setting unit, and then transmitted to the image shift deflector 16.

Figure 1:
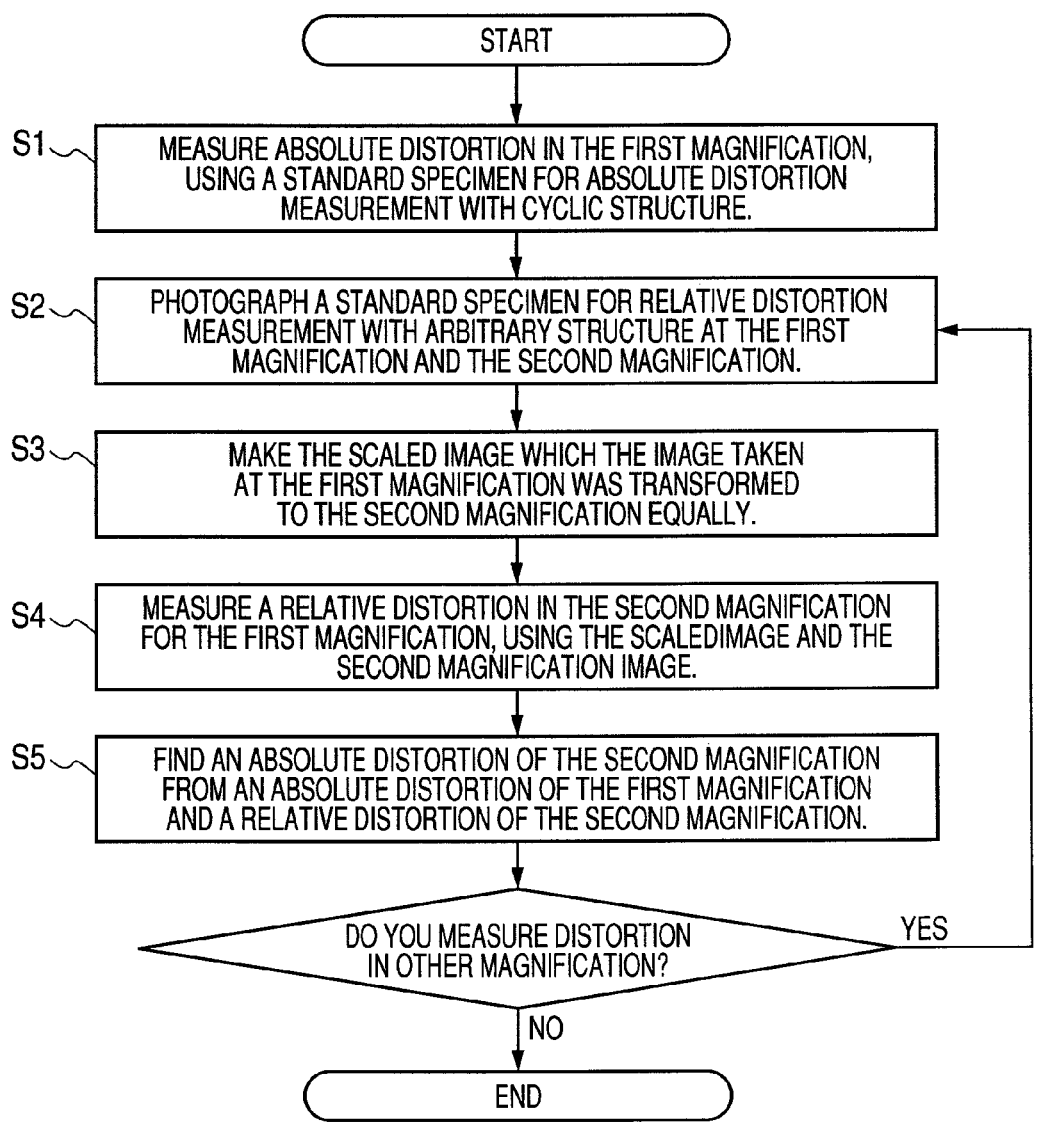
FIG. 1 is a flowchart illustrating a geometric distortion measuring process.

In this embodiment, the geometric distortion is measured in two processes consisting of an absolute distortion measurement and a relative distortion measurement according to a flowchart shown in FIG. 1. The absolute distortion means a geometric distortion of an image with respect to the specimen, and a relative distortion means a geometric distortion of another image with respect to a certain image.

In the measurement of the geometric distortion, the absolute distortion of the first magnification is measured by using a standard specimen with the cyclic structure (Step S1). Then, a specimen with a microscopic structure is photographed at the first magnification and the second magnification (Step S2). Then, the image that has been photographed at the first magnification is equally transformed to the second magnification to make a scaled image (Step S3). Then, a relative distortion in the second magnification for the first magnification is measured by using the scaled image and the image photographed at the second magnification (Step S4). Then, an absolute distortion of the second magnification is found on the basis of an absolute distortion of the first magnification and a relative distortion of the second magnification (Step S5). Hereinafter, the second magnification is replaced with the first magnification, and the above step is repeated to find the absolute distortion at an arbitrary magnification. The absolute distortion at the arbitrary magnification is corrected on the basis of the found measurement results by controlling the respective control units through a computer having a function as the correcting unit.

In the relatively distortion measurement, an image pair having the common viewing field is photographed, and a modification of the viewing field which is attributable to the geometric distortion is measured by pattern matching. The relative distortion measurement does not require a standard specimen with the cyclic structure. The relative distortion measurement can be executed by a general-purpose optical axis adjustment specimen. The suitable specimen is, for example, a specimen whose microscopic structure of from the low magnification to the high magnification can be observed, such as a SEM specimen obtained by coating a glass substrate with a metal amorphous film (osmium, etc.) after latex microparticles are dispersed on the glass substrate or a TEM specimen obtained by depositing gold on a carbon thin film that is placed on a meshed Cu foil in the form of microparticles. It is possible to use plural specimens according to the magnification, and the amorphous specimen for the lower magnification and the amorphous specimen for the higher magnification can be provided. This is because both of specimens are photographed under the same photographing conditions when changing over the specimen, thereby making it possible to take over information on the geometric distortion at that magnification.

As described above, the measuring method is optimized so that the measurement error in the relative distortion can be set to 1% or lower. The dimensional error of the cyclic structure of several 10 nm to several nm pitches which can be observed at the intermediate magnification is about 3% up to now.

Figure 18:
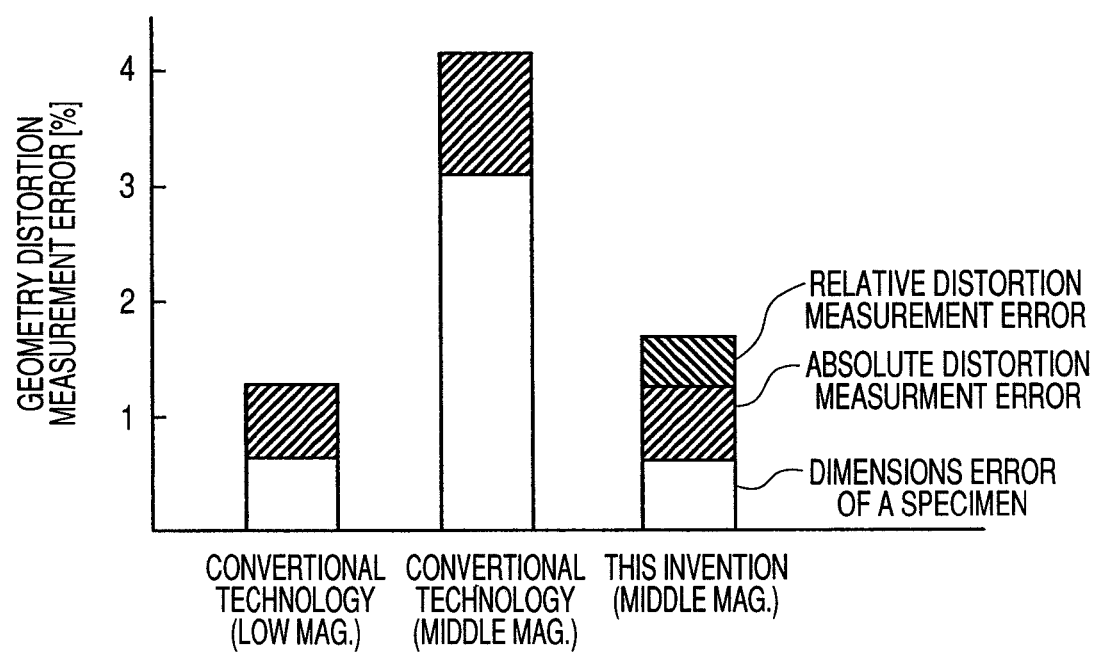
FIG. 18 is an explanatory diagram illustrating a difference in a geometric distortion measurement error between the related art and the present invention.

An example of the geometric distortion measurement error in the case where the correction at the intermediate magnification is implemented between the related art and the present invention is shown in FIG. 18. The geometric distortion at the intermediate and high magnifications is directly measured by using the standard specimen that is low in the dimension precision, to thereby understand that the higher measurement precision is obtained by an indirect measuring method that repeats the relative distortion measurement, beginning at the magnification at which the standard specimen that is 1% or lower in the dimensional error is measured.

Hereinafter, the details of the geometric distortion measuring method will be described.

Figure 16:
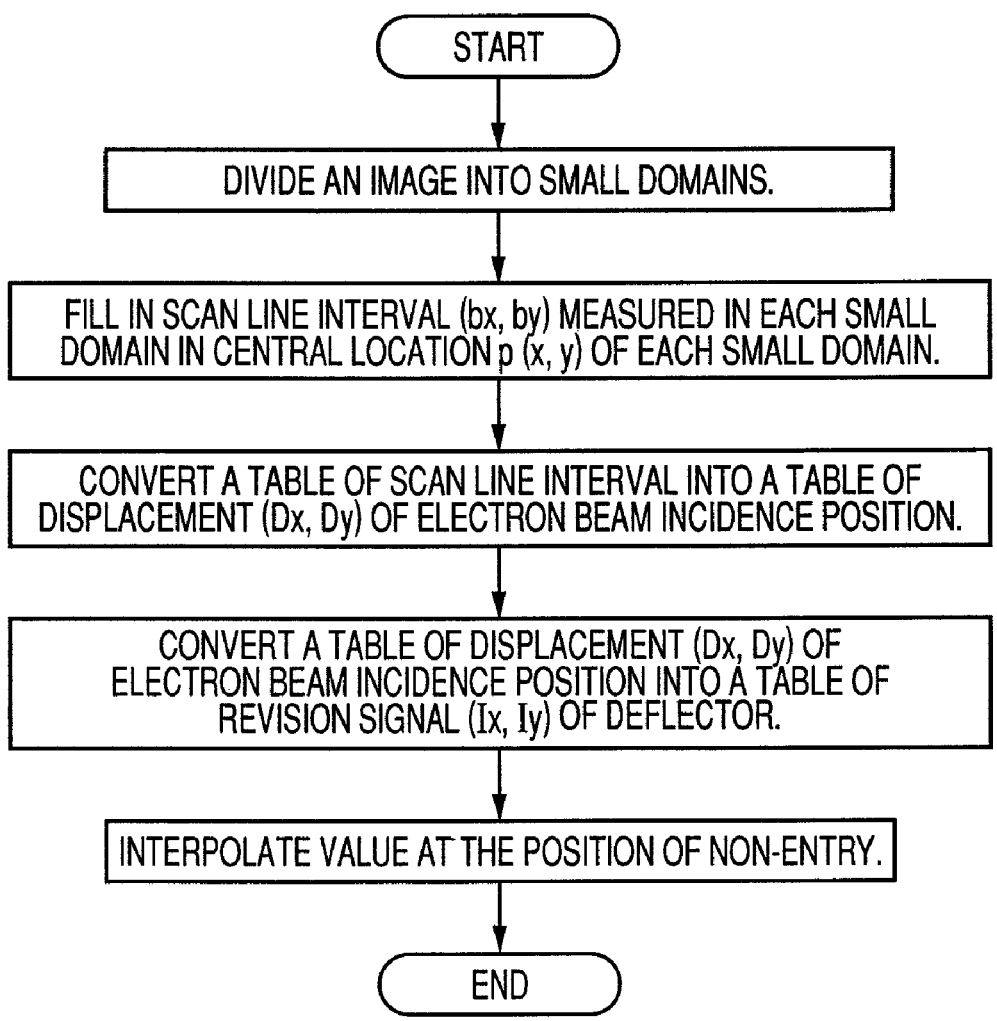
FIG. 16 is a flowchart illustrating a procedure of generating an absolute distortion correction value table.

The absolute distortion measurement is conducted according to a flowchart shown in FIG. 16. In this example, a specimen having a one-dimensional cyclic structure is used. It is assumed that a cyclic interval of the specimen is a, and an angle defined in the X-direction is β. The STEM image of the specimen is photographed, and the STEM image is divided into small domains. It is assumed that an interval of the cyclic structure in the STEM image is c, and an angle formed with respect to the X-direction is γ. First, the interval c of the cyclic structure and the direction γ in each of the small domains are found from a Fourier transform image of the STEM image, which is converted into an interval of the scan lines. An interval bx of the scan lines in the X-direction is calculated by dividing ax=a·cos β (SI unit) by cx=c·cos γ [the number of pixels], and an interval by of the scan lines in the Y-direction is calculated by dividing ay=a·sin β (SI unit) by cy=c·sin γ [the number of pixels]. When there is the geometric distortion, bx and by change within the STEM image. It is determined that the geometric distortion in the X-direction is corrected when all of bx in each of the small domains are equal to each other, and the geometric distortion in the Y-direction is corrected when all of by are equal to each other.

Figure 6A:
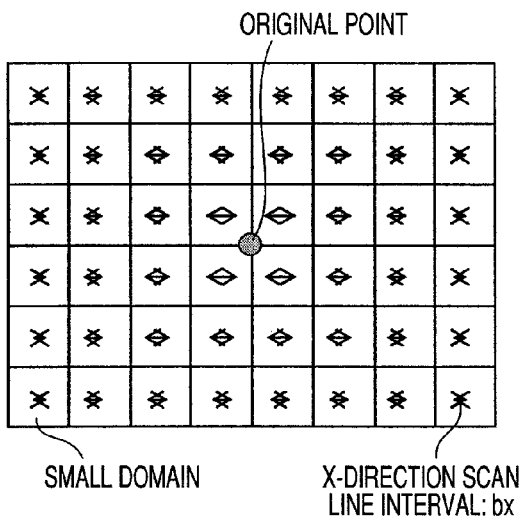
FIGS. 6A to 6D are explanatory diagrams illustrating an absolute geometric distortion correcting process, in which FIG. 6A exemplifies the distribution of intervals bx of scan lines in an X-direction, FIG. 6B exemplifies the distribution of correction values Ix of an X-scanning deflector, FIG. 6C exemplifies the distribution of intervals by of scan lines in a Y-direction, and FIG. 6D exemplifies the distribution of correction values Iy of a Y-scanning deflector.
Figure 6B:
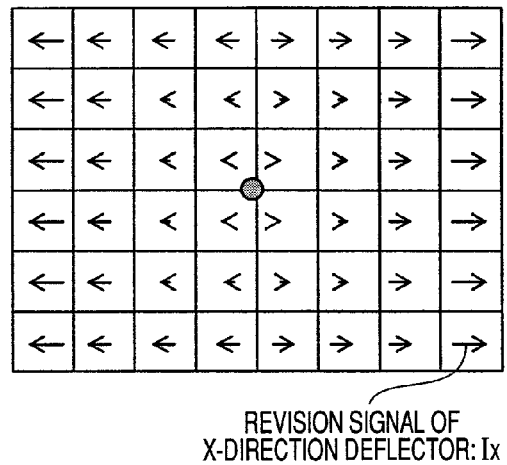
Figure 6C:
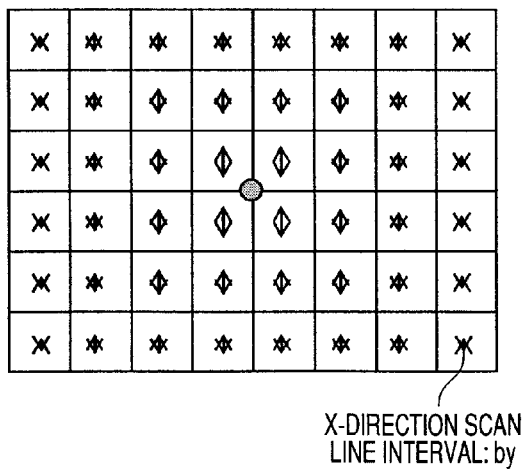
Figure 6D:
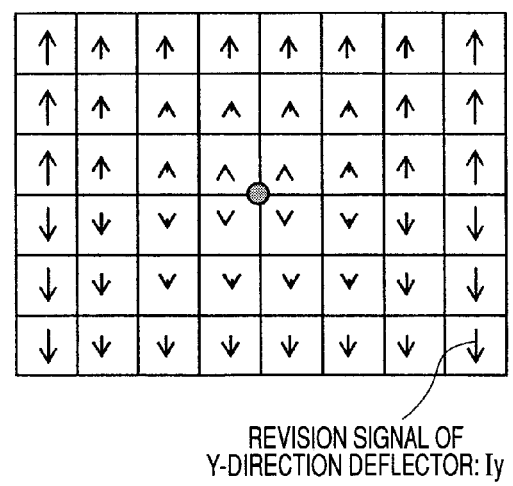

Subsequently, an absolute distortion correction value table is produced on the basis of the intervals bx and by of the scan lines in each of the small domains. The scan line interval table of the X-scanning deflector is produced by plotting the scan line intervals bx that have been measured in the respective small domains at the center positions of the respective small domains (FIG. 6A). Then, the table of the scan line interval bx is converted into the table of the parallel displacement Dx of the electron beam. An original point is selected from the scan line interval table, an integrated value of changes of the interval bx of the scan lines from the original point is found to calculate the parallel displacement Dx of the electron beam input position. Then, the table of the parallel displacement Dx of the electron beam is converted into the table of the correction value Ix of the deflector control value. A relationship between a variation in the deflector control value and the electron beam displacement is measured in advance, and the deflector control value variation required to offset the parallel displacement of the electron beam which is caused by the distortion is obtained, and recorded in the absolute distortion correction value table. Finally, the values of positions that have not been plotted are complemented to complete the table. For example, as shown in FIG. 6A, it is assumed that the interval of the scan lines bx is wide in the vicinity of the center portion of the STEM image, and the interval of the scanning lines bx is narrow in the peripheral portion. It is determined that the input position of the electron beam in the peripheral portion is displaced inside. In order to offset the displacement, it is necessary to displace the electron beam input position in the peripheral portion outside. That is, the values in the absolute distortion correction value table have a distribution shown in FIG. 6B. The absolute distortion correction value table of the Y-scanning deflector is also produced ion the same procedure. The produced absolute distortion correction value table is saved in a memory of the computer 29 together with the magnification.

Figure 5A:
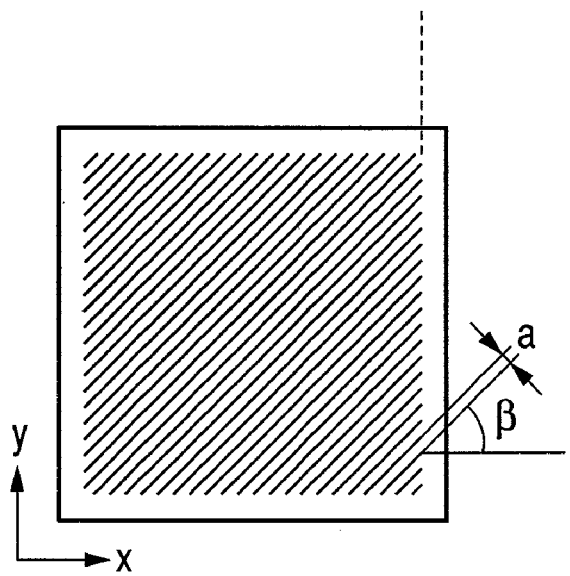
Figure 5B:
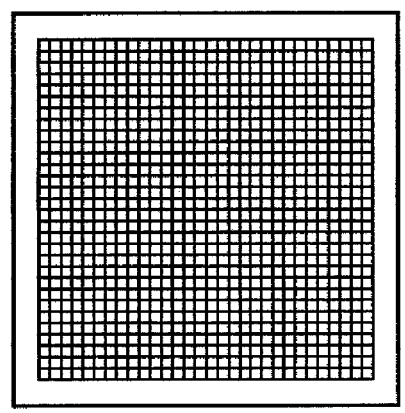
Figure 5C:
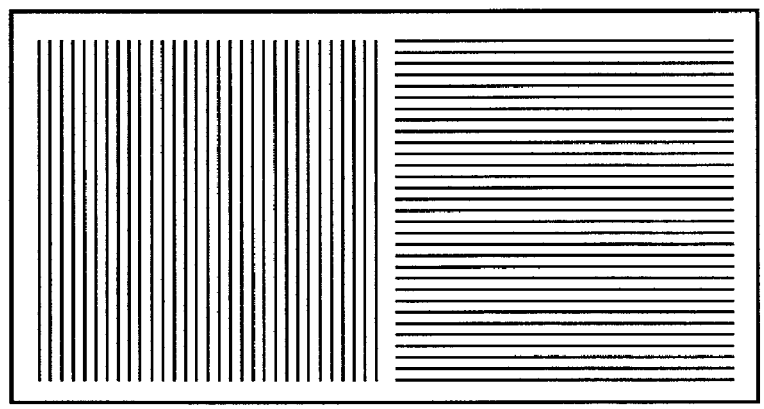

It is desirable that the specimen used in the absolute distortion measurement is about 1% or lower in the dimensional error because the machining precision of the interval a of the cyclic structure directly influences on the measurement precision of the interval b of the scan lines. In the absolute distortion measurement, in order to measure the scan line intervals bx and by in two directions, it is general that two specimens having the one-dimensional cyclic structure are produced as shown in FIG. 5C, and the specimens that are so arranged as to be orthogonal to each other are used. Also, as shown in FIG. 5A, one specimen having a one-dimensional structure is produced, and bx and by can be measured with substantially the same precision with β~45°. As shown in FIG. 5B, it is possible to produce a specimen having two kinds of cyclic structures in one viewing field. However, there is the possibility that the machining precision of the interval a of the cyclic structure is deteriorated when the specimen structure is complicated. In addition, it is possible to use a lattice image in the standard specimen of the absolute distortion measurement. The narrower lattice interval is 0.102 nm of gold single crystal, and the wider lattice interval is 1.0 nm of mica single crystal. It is preferable to set the direction of the cyclic structure to be in parallel to the X-direction and the Y-direction as shown in FIG. 5B since plural cyclic structures are within the image.

Figure 7:
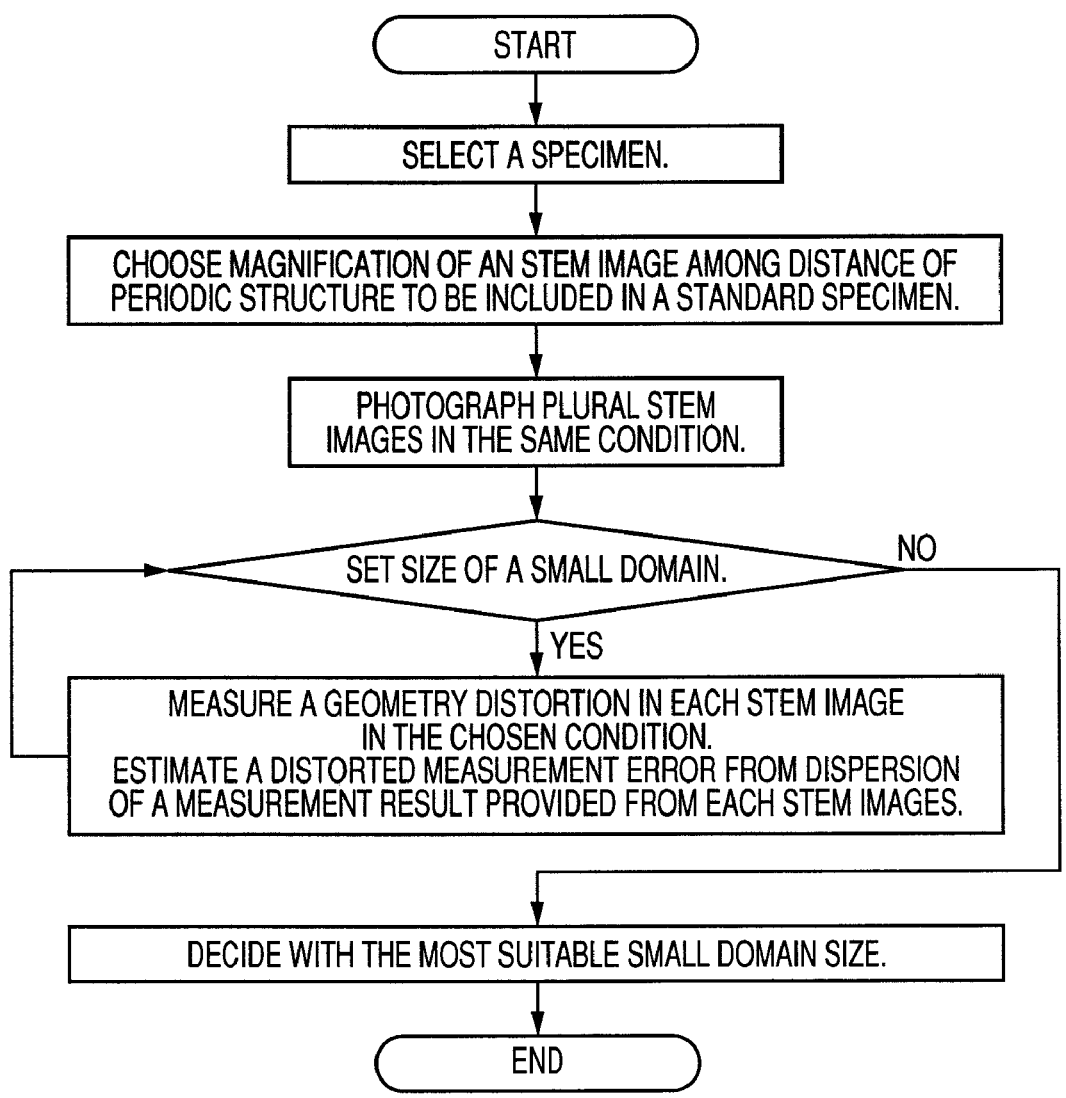
FIG. 7 is a flowchart illustrating a procedure of setting an absolute distortion measurement condition.

Now, a description will be given of a method of setting the viewing field diameter of the STEM image and the number of divided small domains in the absolute distortion measurement. The setting is conducted according to a flowchart shown in FIG. 7. The cyclic interval c is found on the basis of the interval of the peaks that occur in the Fourier transform image. The measurement precision of the cyclic interval c is more improved as the peak interval is wider and the respective peak width is narrower. The peak interval is widest at the time of a two-pixel cycle. Since the peak interval is scaled in the actual measurement, the peak interval is set to be slightly larger than the two pixels. When it is assumed that the specimen is a standard specimen that is 1% or lower in the dimensional error, for example, μ scale (Japanese Patent No. 2544588), and the number of pixels in the TEM image is 1024×1024, it is calculated that the viewing field diameter of the STEM image is suitably about 110 μm that is smaller than (240 nm/2 pixels)×1024 pixels=123 μm by about 10%. This corresponds to the viewing field at the lowest magnification in the STEM. Then, the number of divisions in dividing the photographed image into the small domains is set. The peak width is narrower as the cyclic number n included in the small domains is more increased, to thereby improve the distortion measurement precision. However, the viewing field diameter of the small domains is more increased as the cyclic number n is more increased, and the space resolution of the distortion measurement is deteriorated. It is necessary to set the size of the small domains taking the measurement precision and the space resolution into consideration. A change in the distortion measurement precision at the time of changing the size of the small domains is measured in advance, and the size of the small domains is set on the basis of the measured change in the measurement precision. It is determined that it is proper to divide the photographed image into 22×22 with the size of the small domains as 5 μm×5 μm since the measurement precision in the μ scale 20 cycle is about 0.1% under the photographing conditions that have been conducted by the present inventors. As a result, it is necessary to increase the number of cycles included in the small domains in the case where the distortion measurement precision higher than the above precision is required. In the case where the space resolution of the distortion distribution is required more than the distortion measurement precision, it is necessary to decrease the number of cycles that are included in the small domains.

Also, as another method of measuring the absolute distortion, there is a method using a moiré stripe. The advantage of the method using the moiré stripe resides in that a slight change in the scan line interval can be visualized without using image processing. However, since the method using the moiré stripe is lower in the space resolution than the method using the Fourier transform, the method can be appropriately selected according to the use purpose.

Subsequently, a description will be given of the relative distortion measurement. In the geometric distortion measurement flowchart shown in FIG. 1, Step S2 and the subsequent steps are constituted by the relative distortion measurement flowchart. It is preferable to set the first magnification as a reference to be lower, that is, to be wider in the viewing field in the geometric distortion correction. When the viewing field of the image that has been photographed at the second magnification is wider, the peripheral portion of the image at the second magnification is formed in an area where no image is photographed at the first magnification. The relative distortion cannot be measured in the peripheral portion. In the case where the geometric distortion in the peripheral portion can be complemented from the geometric distortion in the center portion of the image, the first magnification can be made higher than the second magnification. However, in the case where it is necessary to directly measure the geometric distortion in the peripheral portion, the first magnification needs to be made lower than the second magnification.

Hereinafter, the details of the respective steps will be described with reference to FIG. 8. In Step S2, the phase distortion measurement specimen is photographed at a first magnification where the geometric distortion has been measured, and at a second magnification where the geometric distortion has not been measured. The absolute distortion correction value table (Ix1, Iy1) at the first magnification has been already produced. The image can be photographed at the first magnification by the aid of the absolute distortion correction value table (Ix1, Iy1), or the image can be photographed by setting the correction value table to zero. The same is applied to the image photographed at the second magnification. In any cases, the selected correction value table is recorded in the memory of the computer 29 in advance. In this example, the image at the first magnification is photographed by the aid of the absolute distortion correction value table (Ix1, Iy1) (FIG. 8A), and the image at the second magnification is photographed with the correction value table as zero (FIG. 8C).

Figure 8A:
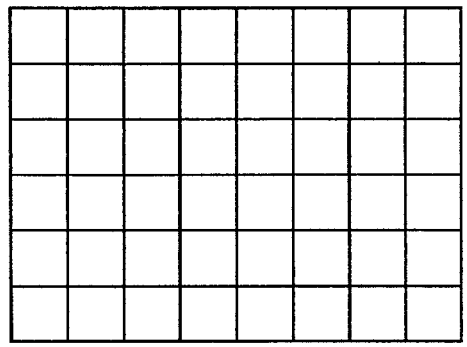
FIGS. 8A to 8E are explanatory diagrams illustrating a relative distortion measuring process, in which FIG. 8A exemplifies a distortion measured image, FIG. 8B exemplifies a scaled image, FIG. 8C exemplifies a distortion unmeasured image, FIG. 8D exemplifies a correction value table of the X-scanning deflector, and FIG. 8E exemplifies a correction value table of the Y-scanning deflector.
Figure 8B:
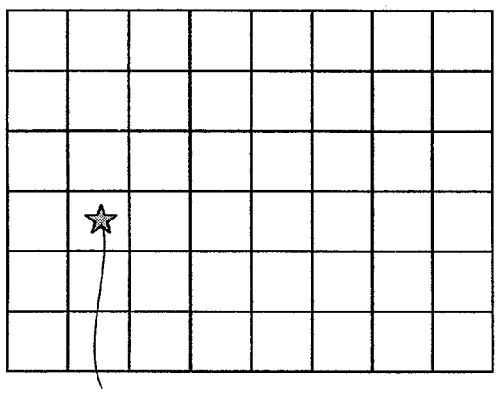
Figure 8C:
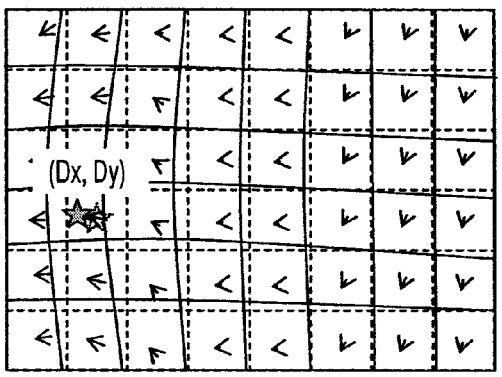
Figure 8D:
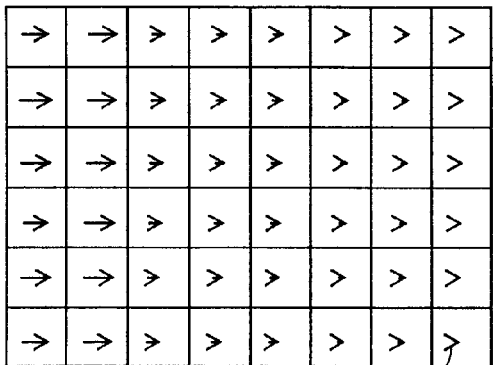
Figure 8E:
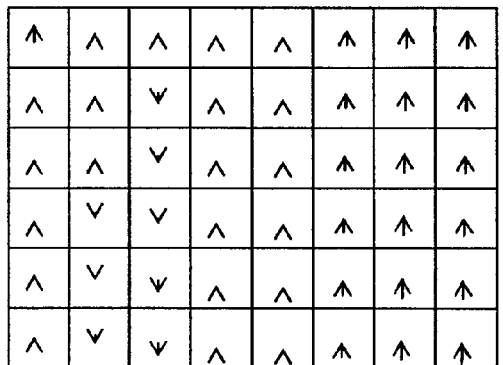

In Step S3, the image at the first magnification (FIG. 8A) is equally transformed to the second magnification to generate a scaled image (FIG. 8B). The ratio of the second magnification to the first magnification is found through a magnification measuring method with a high precision as disclosed in K. Takita, T. Aoki, Y. Sasaki, T. Higuchi and K. Kobayashi, "High-Accuracy Subpixel Image Registration Based on Phase-Only Correlation", IEICE Trans. Fundamentals, Vol. E86-A, No. 8, p 1925-1934 (August 2003). From the past experimental results, the number of pixels is 400×400, the magnification measurement error in the magnification ratio to 1 is about 0.02%, and the magnification measurement error in the magnification error to 1.5 is about 0.05%, which are higher in precision than other measuring methods.

Figure 17:
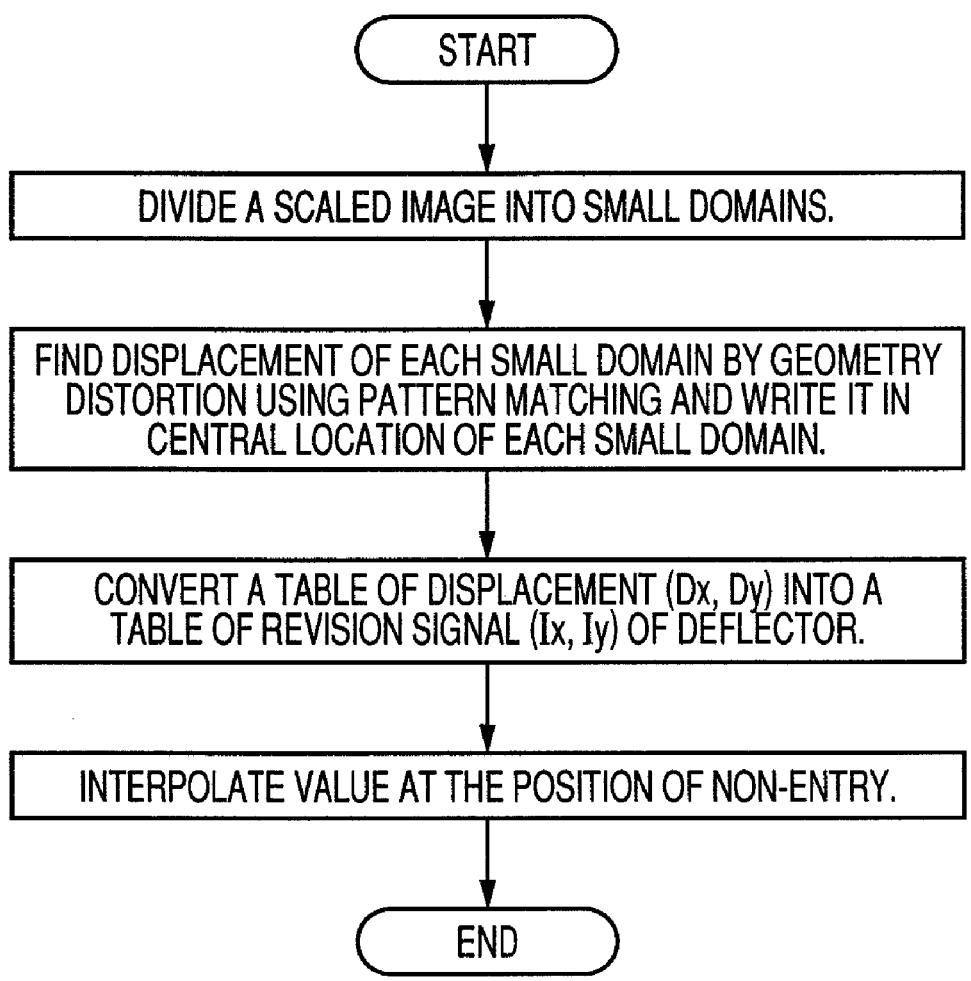
FIG. 17 is a flowchart illustrating a procedure of generating a relative distortion correction value table.

In Step S4, the relative distortion of the image (FIG. 8C) of the second magnification to the scaled image (FIG. 8B) is measured. A procedure of the relative distortion measurement in Step S4 is shown in FIG. 17. First, the scaled image is divided into small domains, and the center positions (x, y) of the respective small domains are recorded. For example, attention is paid to a small domain that is denoted by an asterisk in FIG. 8B. When it is assumed that the image (FIG. 8C) of the second magnification is distorted as indicated by a solid line, the position of the asterisk is displaced to a position indicated in FIG. 8C in parallel. With the small domain denoted by the asterisk in FIG. 8B is regarded as a reference pattern, and the parallel displacement (Dx, Dy) that is attributable to the geometrical distortion is found by pattern matching. As the algorithm of the pattern matching, there are a phase selected correlation, a standardized mutual correlation method, and a least square method. The parallel displacement table is produced by plotting the parallel displacement that has been measured by plotting the respective small domains to the center of the respective small domains (FIG. 8C). In order to correct the measured distortion under the reflector control, there is found a deflector control value (dIx12, dIy12) necessary to offset the parallel displacement (Dx, Dy) which is caused by the geometric distortion. A relationship between the parallel displacement of the viewing field and the deflector control value variation is measured in advance. The X-deflection relative distortion correction table (FIG. 8D) and the Y-deflection relative distortion correction table (FIG. 8E) are produced from the table of the parallel displacement on the basis of the relationship. The values of the positions that have not been plotted are complemented, and the relative distortion correction value table is completed. The completed relative distortion correction value table is recorded in the memory within the computer. Not the image that has been photographed at the first magnification but the image that has been photographed at the second magnification is divided into the small domains so that the parallel displacement that is attributable to the geometric distortion can be found with the divided small domains as the reference pattern.

In a device where the electron beam scan is controlled in an analog fashion, or in a device where an image is photographed by a camera as in a TEM (transmission electron microscope), the photographed image is geometrically transformed within the computer, thereby making it possible to obtain an image whose geometric distortion has been corrected. In this case, the values of the positions that have not been plotted in the parallel displacement table are complemented to complete the parallel displacement table, and the parallel displacement table is recorded in the memory within the computer. Also, it is possible that not the parallel displacement table per se, but a value that has been converted into a parameter necessary for the geometric distortion correction that is attributable to the image processing is recorded in the computer. In addition, in the case where an object to be measured or a measuring method is designated as in a CD-SEM (critical dimension scanning electron microscope), the length measurement result is corrected after the specimen configuration has been measured in the length by the aid of the distortion uncorrected image. A flow that corrects the length measurement result is more effective than a flow that generates the undistorted image every time the image is taken in. In this case, the parallel displacement that is attributable to the geometric distortion is converted into the table of the correction parameter of the length measurement result, and recorded in the computer.

In Step S5, the absolute distortion at the second magnification is found. In this case, in Step S2, the image at the first magnification is photographed by using the absolute distortion correction value table (Ix1, Iy1), and the image at the second magnification is photographed with the correction value table being set to zero. In this case, since the image that has been photographed at the first magnification can be assumed as an image having no absolute distortion, the relative distortion correction value table (dIx12, dIy12) that has been measured in Step S4 can be assumed as an image having no absolute distortion, the relative distortion correction value table (dIx12, dIy12) that has been measured in Step S4 can be set as the absolute distortion correction value table (Ix2, Iy2) at the second magnification. As another photographing condition, in the case where the image at the first magnification and the image at the second magnification are photographed with the correction value table being set as zero in Step S2, the relative distortion correction value table (dIx12, dIy12) that has been measured in Step S4 is added to a correction value table obtained by transforming the absolute distortion correction value table (Ix1, Iy1) at the first magnification in correspondence with the second magnification to obtain an absolute distortion correction value table (Ix2, Iy2) at the second magnification. Also, as another photographing condition, in the case where the absolute distortion correction value table (Ix1, Iy1) at the first magnification is used for the first magnification, and a correction value table obtained by transforming the absolute distortion correction value table at the first magnification in correspondence with the second magnification is used for the second magnification in Step S2, when the relative distortion correction value table (dIx12, dIy12) that has been measured in Step S4 is added to the transformed correction value table, the absolute correction value table (Ix2, Iy2) at the second magnification is obtained. The absolute distortion correction value table (Ix2, Iy2) at the second magnification is recorded in the memory within the computer 29 together with the second magnification.

Thereafter, the absolute distortion correction value table at an arbitrary magnification can be obtained by repeating the above relative distortion measurement with the second magnification as the first magnification. The geometric distortion is corrected on the basis of the absolute distortion correction value table that has been produced in the above procedure by means of the scanning deflection control unit 17' or the image shift deflector control unit 16'.

Figure 4A:
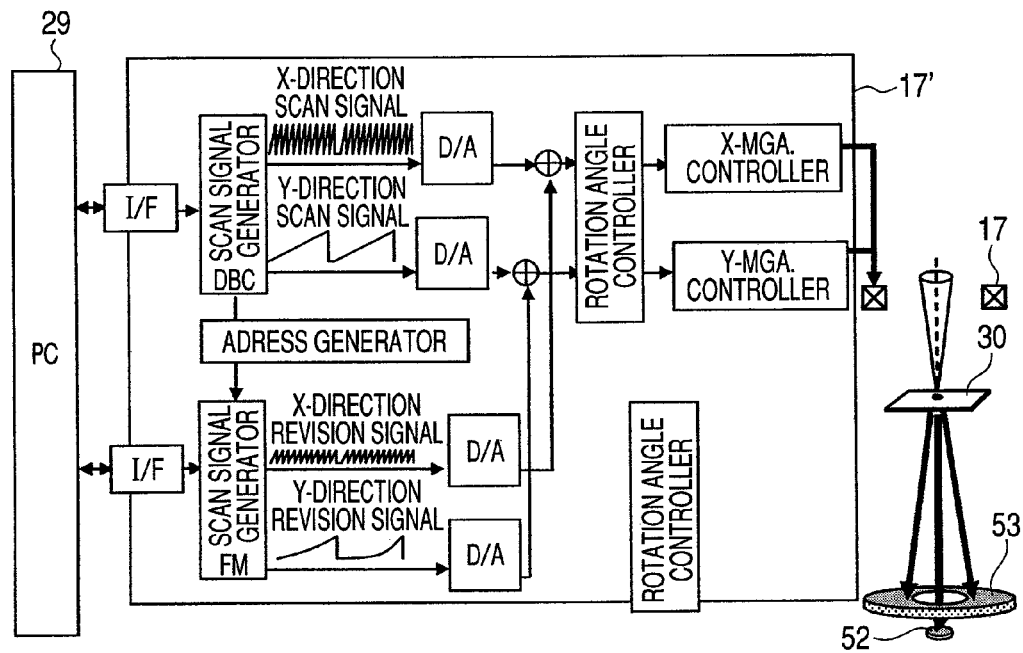
FIG. 4A is a diagram illustrating a basic structure of a scanning deflector control section having a geometric distortion correcting function.
Figure 4B:
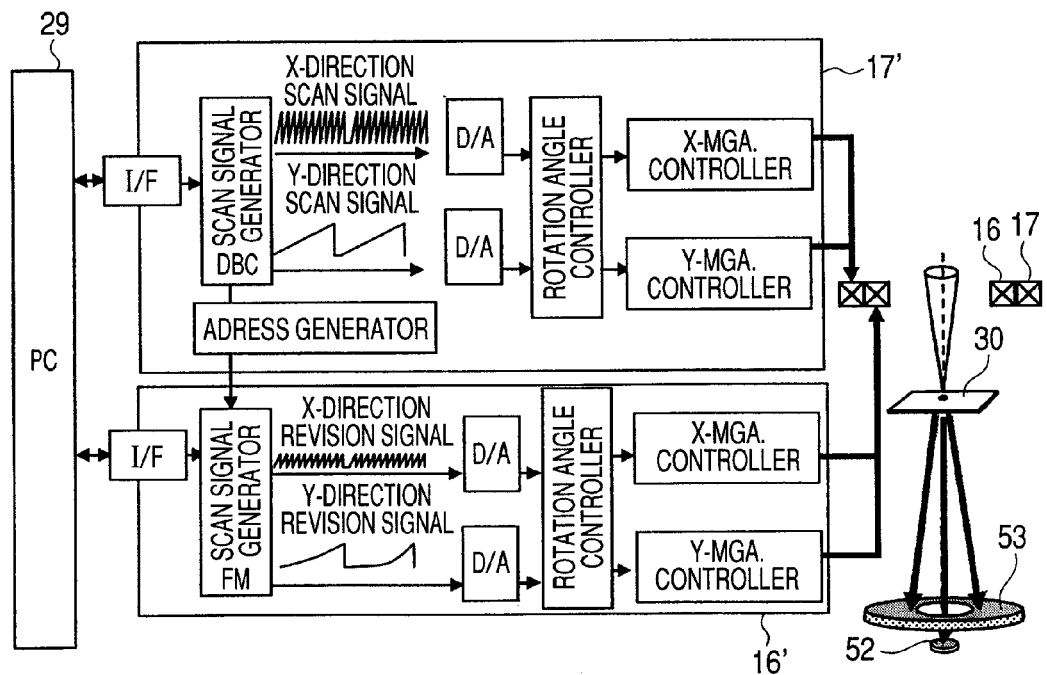
FIG. 4B is a diagram illustrating a basic structure of an image shift deflector control section having a geometric distortion correcting function.

The measured geometric distortion is corrected in the following method. In the case where the electron beam scan is digitally controlled in a device that forms an image by raster scan of the input electron beam, it is possible to correct the distortion under the scanning deflector control. In the digital control, the control value of the X-scanning deflector and the control value of the Y-scanning deflector are allocated to each of the pixels. The correction values that offset the geometric distortion are added to those control values to correct the geometric distortion. The scanning deflection control unit 17' or the image shift deflector control unit 16' is used for the geometric distortion correction. FIG. 4A is a structural diagram in the case where the geometric distortion is corrected by means of the scanning deflector control unit 17'. There are provided an FM (frame memory) that stores a correction value table together with a control value table that is stored in a DBC (digital beam controller) therein. An initial value of the correction value table is set to zero, and the deflector is controlled by the initial value of the control value table to photograph the STEM image. The geometric distortion of the STEM image is found, and a control value that offsets the geometric distortion is calculated and then recorded in the computer 29 as the correction value table. The correction value table is called from the computer 29, and stored in the FM. The DA converted value of the correction value table which is stored in the FM and the DA converted value of the control value table which is stored in the DBC are added together, and then transmitted to the scanning deflector 17 through the rotation angle setting unit and the magnification setting circuit. Alternatively, there is a configuration in which the control value table of the DBC is updated is updated by the added value of the control value table and the correction value table without providing the FM for the correction value table. The reason that the FM is additionally provided in this example, is because a configuration in which the FM is readily added to the existing device as an option is made. Also, there is a configuration in which the image shift deflector control unit 16' is used for correction. The structural diagram in this case is shown in FIG. 4B. The scan signal that has been generated on the basis of the correction value table is converted by the D/A converter, the rotation angle setting unit, and the magnification setting unit, and thereafter is transmitted to the image shift deflector 16. This configuration is also readily adapted to add an option.

Figure 15:
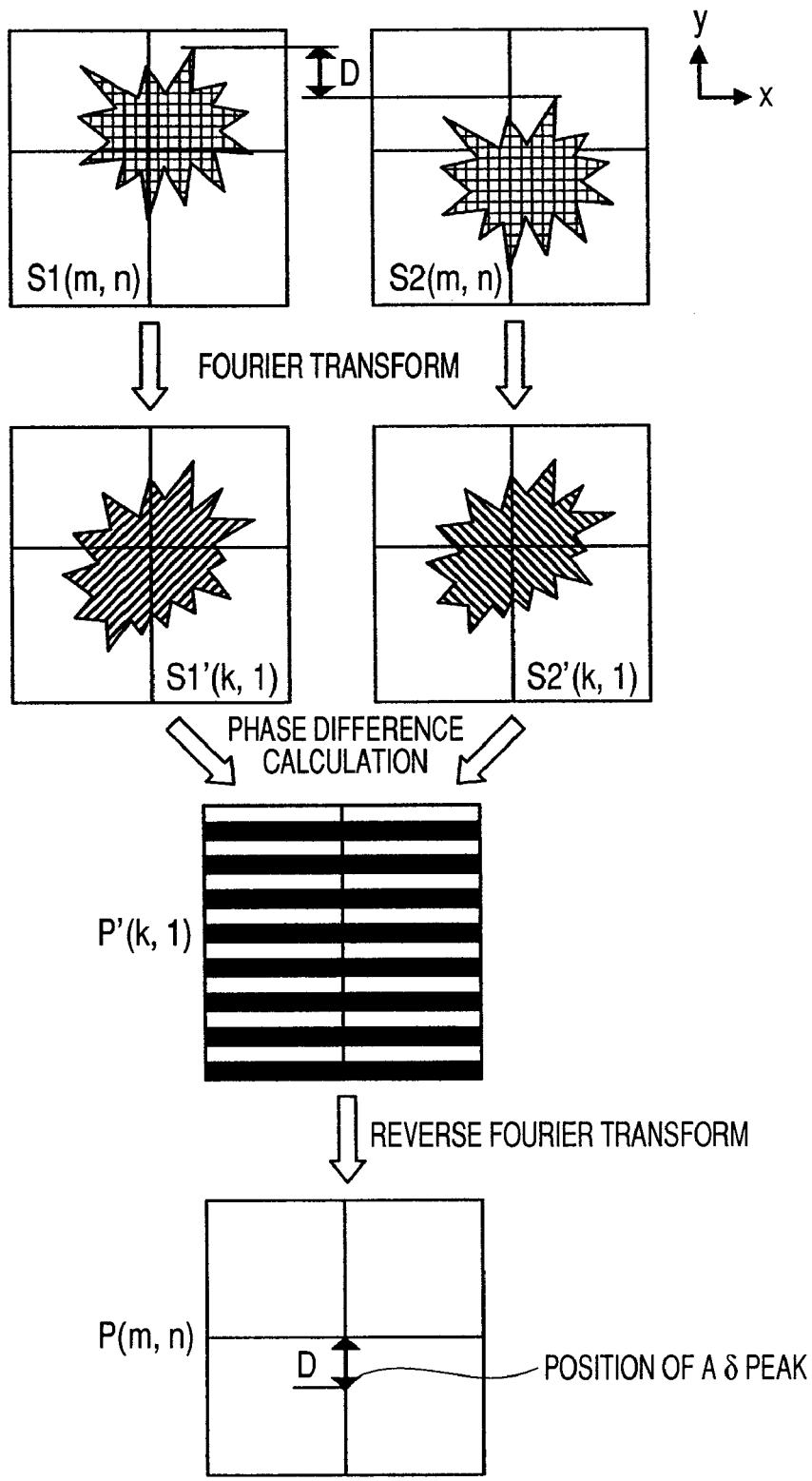
FIG. 15 is an explanatory diagram illustrating a parallel displacement measuring method.

Now, a description will be given of the phase selected correlation method used for the present parallel displacement measurement with reference to FIG. 15. $S1(n, m)=S2(n+D_x, m+D_y)$ is described when it is assumed that two discrete images having a positional displacement $D=(D_x, D_y)$ are $S1(n, m)$ and $S2(n, m)$. It is assumed that the two-dimensional discrete Fourier transforms of $S1(n, m)$ and $S2(n, m)$ are $S1'(k, l)$ and $S2'(k, l)$. Since there is the formula of $F\{S(n+D_x, m+D_y)\}=F\{S(n, m)\}\exp(iD_x \cdot k+iD_y \cdot l)$ as the Fourier transform, the positional displacement can be transformed to $S1'(k, l)=S2'(k, l)\exp(iD_x \cdot k+iD_y \cdot l)$. In other words, the positional displacement of $S1'(k, l)$ and $S2'(k, l)$ is represented by the phase difference $\exp(iD_x \cdot k+iD_y \cdot l)=P'(k, l)$. Since $P'(k, l)$ is a wave having a cycle of $(D_x, D_y)$ a δ-like peak occurs at the position of $(D_x, D_y)$ in an analysis image $P(n, m)$ into which the phase difference image $P'(k, l)$ has been subjected to inverse Fourier transform. All of the information on the amplitude may not be removed. Even if the amplitude component of $S1'(k, l) \cdot S2'(k, l)^* = |S1'||S2'| \exp(iD_x \cdot k+iD_y \cdot l)$ is subjected to log or $\sqrt{}$ processing to calculate the image whose amplitude component is suppressed, and the calculated image is subjected to the inverse Fourier transform, the δ-like peak occurs at the position of $(D_x, D_y)$ of the position displacement vector. Therefore, the positional displacement can be analyzed on the basis of the above calculated image. Since the δ-like peak occurs at the position of $(-D_x, -D_y)$ even if the phase difference image $P'(k, l)$ is subjected to Fourier transform, it is possible to execute the positional displacement analysis on the Fourier transform image of the phase difference image $P'(k, l)$.

Since it can be assumed that only the δ-like peak exists in the analysis image $P(n, m)$, the δ-like peak position is required with precision after decimal point by barycentric position calculation or function fitting. Also, since the peaks other than the δ-like peak can be regarded as noises, a ratio of the δ-like peak intensity to the intensity of the entire analysis image $P(n, m)$ can be regarded as the degree of a coincidence between the images. In the conventional position displacement analysis method, it is difficult to evaluate the reliability of the position displacement analysis result, and even if an erroneous positional displacement is output because the frequency component necessary for analysis is short, the analysis and correction flow is advanced on the basis of the erroneous positional displacement. On the contrary, since the degree of coincidence is output in the positional displacement analysis method, there is provided a function of setting a lower limit of the degree of coincidence, and automatically conducts a countermeasure such as retaking the image when the degree of coincidence is equal to or lower than the lower limit. More specifically, there is provided a flow in which after the values of the small domains which cannot be correctly measured are automatically removed, the correction value is interpolated. In the case where the ratio of the small domains that are determined as measurement disenable is equal to or higher than a set value, an error message that requests the retaking of an image is displayed.

Also, it is possible to evaluate the rough relative distortion quantity by referring to the degree of coincidence. The degree of coincidence between the scaled image and the image of the second magnification is calculated. Since the degree of coincidence is more increased as the relative distortion quantity is smaller, it is determined that the relative distortion quantity is substantially zero when the degree of coincidence is equal to or higher than a constant value. In this case, the relative distortion measurement in Step S4 can be omitted. It is possible to determine whether the relative distortion has been corrected, or not, by referring to the degree of coincidence. In the case where the degree of coincidence between the corrected image where the distortion has been corrected on the basis of the relative distortion correction results and the scaled image is increased as compared with the degree of coincidence between the image that has not yet been corrected and the scaled image, it is determined that the relative distortion has been corrected.

In the case where the relative distortion quantity of the second magnification to the first magnification is large, and the relative distortion cannot be corrected to a desired value or lower in the result that has been obtained in the first measurement, the following repetitive correction is implemented. The image of the first magnification is photographed on the basis of the absolute distortion correction table, and the image of the second magnification is photographed by the aid of the absolute distortion correction table. The relative distortion correction table is produced in the procedure of Steps S3 and S4. The relative distortion correction table is added to the absolute distortion correction table at the second magnification. The added table is an absolute distortion correction table at the second magnification. The above correction is repeated, to thereby reduce the relative distortion of the second magnification to the first magnification to a desired value or lower.

In the case where it is estimated that the geometric distortion quantity is large, or in the case where the higher analysis precision is demanded, when not only the parallel displacement between the images but also the amount of rotation and the magnification are measured, the measurement precision of the parallel displacement is improved. In the case where the geometric distortion quantity is small, only the measurement of the parallel displacement is conducted in order to shorten a calculation time. For example, in the case where the parallel displacement, the amount of rotation, and the magnification are measured at the time of producing the recipe, and the amount of rotation and the magnification are equal to or lower than given values that are designated by the user, only the parallel displacement is measured.

Figure 9:
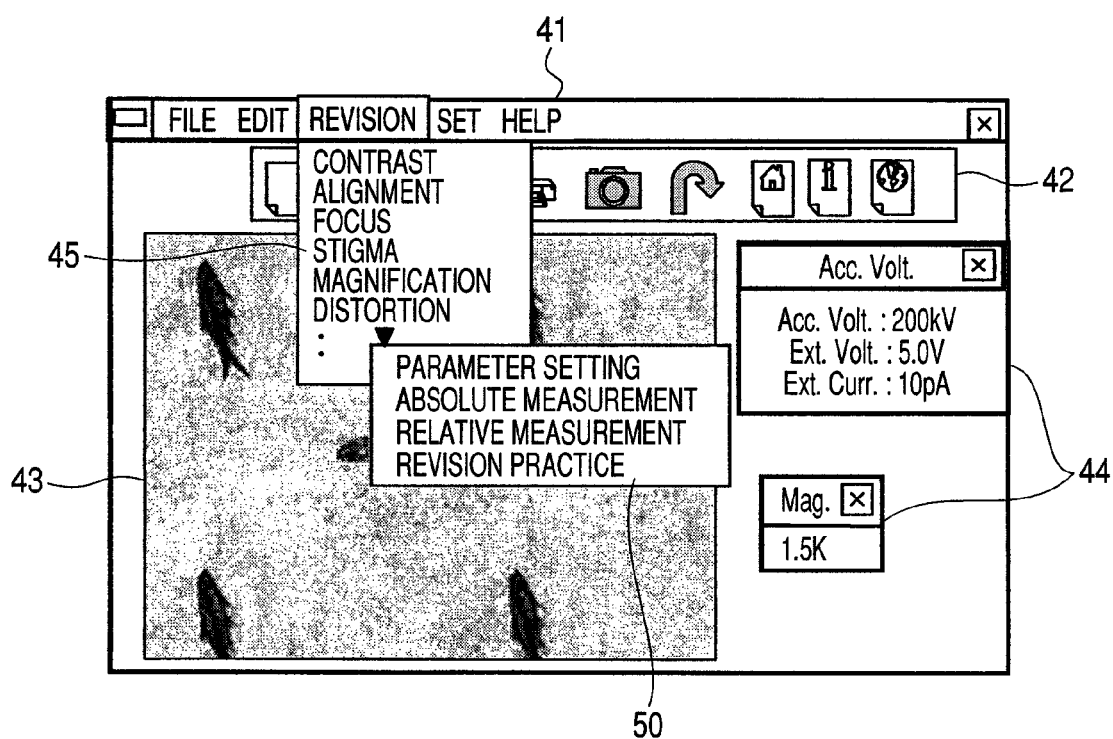
FIG. 9 is a diagram illustrating a basic structure of a main window.

Finally, a description will be given of a control screen used for the geometric distortion correction. FIG. 9 shows a basic configuration of a main window of the computer 29. The main window is made up of a menu bar 41 along which the processing contents of control software are arranged, a tool bar 42 along which the processing contents are iconized and arranged, a figure window 43 on which the STEM image is displayed, and a sub-window 44 used for displaying or setting diverse parameters. The processing contents of "parameter setting", "absolute measurement", "relative measurement", or "correction execution" can be selected from the menu bar or the tool bar. When "parameter setting" is selected, the window for setting the geometric distortion measurement parameter is displayed (FIG. 10). Boxes are displayed at each of the magnifications in the window, and any one of the absolute measurement, the relative measurement, and the unmeasurement is selected. When the magnification at which the absolute measurement has been selected is doubly clicked, an absolute distortion measurement condition window shown in FIG. 11A is displayed. The select magnification at which the absolute distortion is measured from now is displayed in a display box 47. An interval a of the periodic structure and the number of partitions of small domains in the standard specimen are input to an input box 48. When the magnification at which the relative measurement has been selected is doubly clicked, a window shown in FIG. 11B is displayed. A select magnification at which the relative distortion is measured is displayed in the display box 47. The magnification of the image which is a reference of the relative measurement, and the number of partitions of the small domains are input in the input box 48. When the magnification at which the unmeasurement has been selected is doubly clicked, a window shown in FIG. 11C is displayed. The measurement of the geometric distortion is not implemented at the above magnification, and the correction value table is produced on the basis of the geometric distortion that has been measured at another magnification. The magnification at which the correction value table is referred to is input in the input box 48 of the window. Push bottoms for displaying the measurement results are disposed in the respective windows of FIGS. 11A to 11C. When the bottoms are clicked after the geometric distortion has been measured, a measurement result display window shown in FIG. 11D is displayed, and the measurement result is displayed so as to be superimposed on the STEM image. As the measurement result, there are prepared the interval of scan lines (bx, by), the parallel displacement (Dx, Dy) of the electron beam input position, the relative distortion correction value (dIx, dIy), the absolute distortion correction value (Ix, Iy), and the degree of agreement. The measurement result to be displayed can be selected by a pull-down menu 46. Although being not shown in FIG. 11, it is possible to display the measurement results shown in FIGS. 6 and 8, independently. It is possible to display the measurement results as not arrows but a numeric scheme.

Figure 10A:
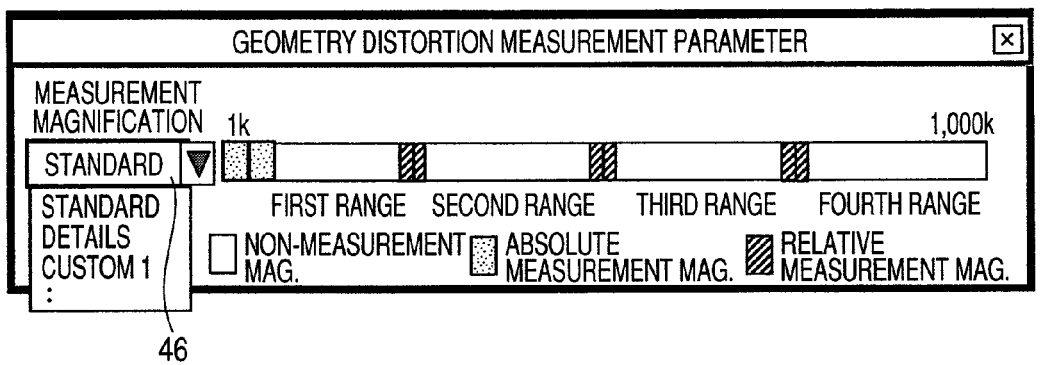
FIGS. 10A to 10C are diagrams illustrating a basic structure of a geometric distortion correction parameter setting window, in which FIG. 10A exemplifies a standard setting, FIG. 10B exemplifies details setting, and FIG. 10C exemplifies custom setting.
Figure 10B:
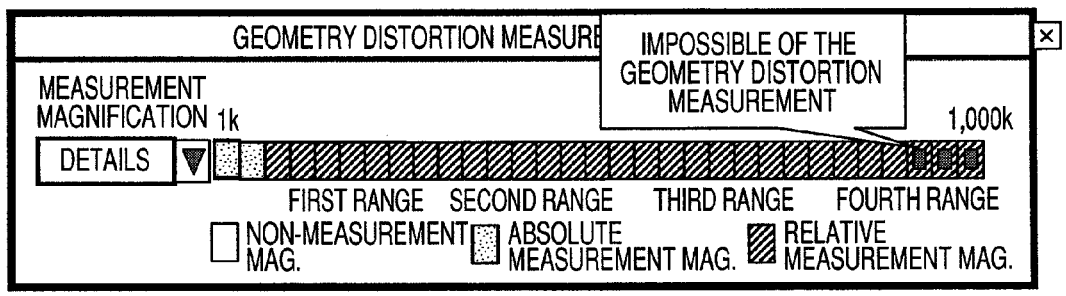
Figure 10C:
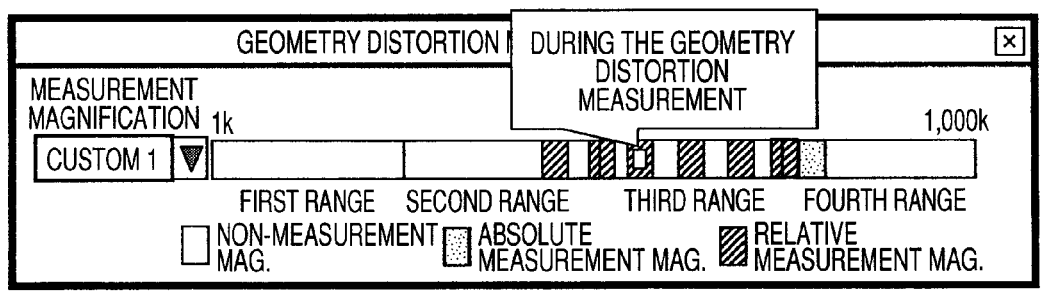
Figure 11A:
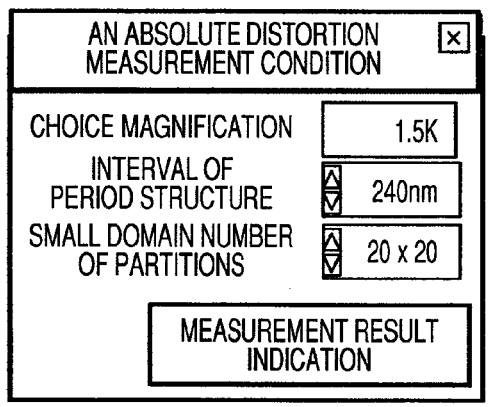
FIGS. 11A to 11C are diagrams illustrating a basic structure of a window for inputting the absolute distortion measurement condition, the relative distortion measurement condition, and the distortion unmeasurement condition, respectively.
Figure 11B:
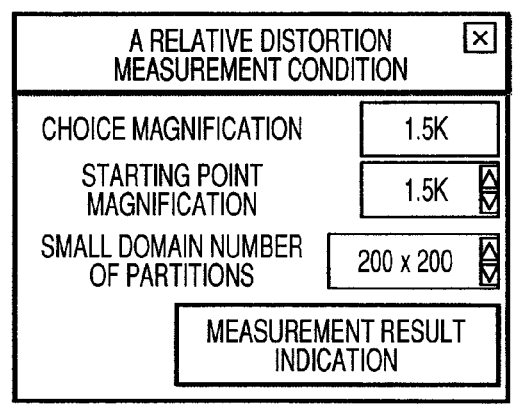
Figure 11C:
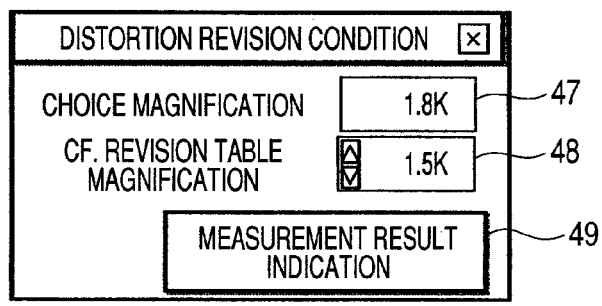
Figure 11D:
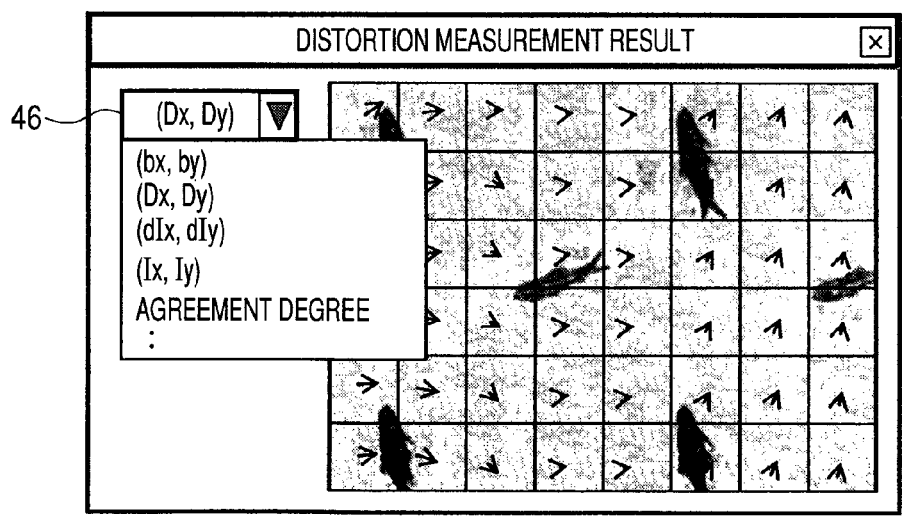
FIG. 11D is a diagram illustrating a basic structure of a window for displaying the distortion measured result.

In the setting of the geometric distortion measurement parameter, several settings that are high in the use frequency are prepared, and can be selected from the pull-down menu 46 shown in FIG. 10. For example, in the case where the geometric distortions at the respective magnifications are unknown at all, it is necessary to measure the geometric distortions at all of the magnifications. In this case, setting shown in FIG. 10B is selected. In other words, the geometric distortion measurement is implemented at all of the magnifications. The absolute distortion measurement is selected at the magnification at which the absolute distortion can be measured by the standard specimen, and the relative distortion measurement is selected at other magnifications. As another case, there is a case in which the geometric distortion of some degree can be predicted from the past experimental results. For example, it is assumed that the scan distortion changes at the time of changing over the magnification setting unit, and the scan distortion hardly changes when the same magnification setting unit is used even if the magnification changes. In this case, the geometric distortion correction is implemented under the condition shown in FIG. 10A. In this example, it is assumed that four magnification setting units for a first range, a second range, a third range, and a fourth range are changed over from the lower magnification for use. Since the geometric distortion that is caused by the distortion aberration is actualized in the first range, the geometric distortion measurement is implemented in each of the magnifications from the lowest magnification to produce the distortion correction value table. The geometric distortion measurement is completed at the time of changing over to the magnification at which the geometric distortion that is caused by the distortion aberration can be ignored. The absolute distortion correction value table that has been produced at this time is used at the remaining magnifications as a first range absolute distortion correction value table. A second range absolute distortion correction value table is produced from the first range absolute distortion correction value table and the relative distortion correction value table that has been measured on the basis of the image which has been photographed at the highest magnification of the first range and the image that has been photographed at the lowest magnification of the second range. The absolute distortion correction value table is used at another magnification in the second range. A third range absolute distortion correction table and a fourth range absolute distortion correction table are produced in the same procedure to implement the geometric distortion correction. Also, it is possible to set the geometric distortion measurement condition according to the user needs. For example, it is possible to conduct the absolute measurement by the aid of a lattice image that has been observed at the high magnification as shown in FIG. 10C. The setting condition can be saved as a custom condition.

Figure 12:
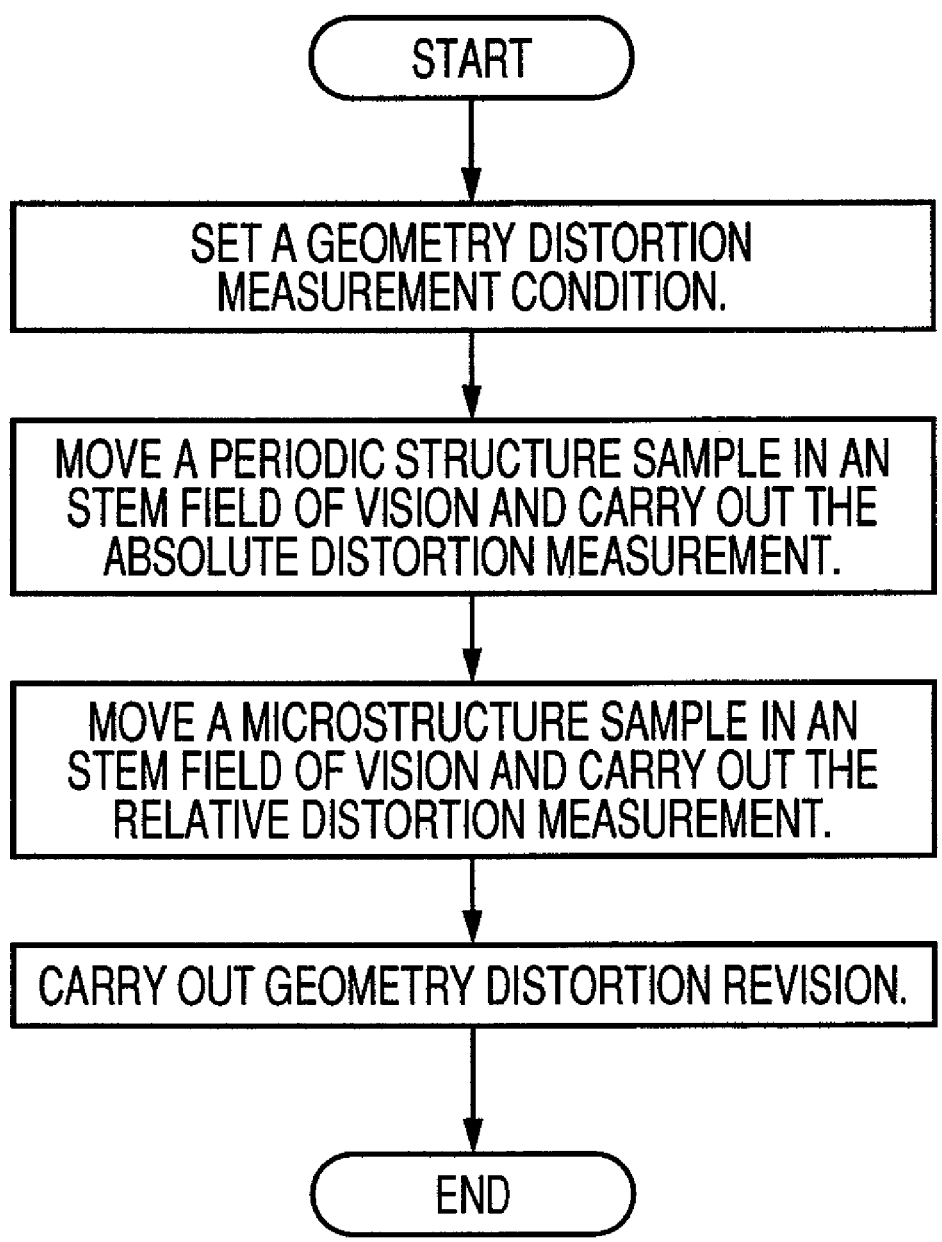
FIG. 12 is a flowchart illustrating a geometric distortion correcting process.

After the geometric distortion measurement condition has been set, the geometric distortion correction is implemented by a flow shown in FIG. 12. When the periodic structure specimen is displaced within the STEM viewing field, and "absolute measurement" is selected from the menu shown in FIG. 9, the image of the magnitude at which the absolute measurement has been set is photographed to produce "correction value table". Then, when the microscopic structure specimen is displaced within the STEM viewing field, and "relative measurement" is selected from the menu shown in FIG. 9, the image of the magnitude at which the relative measurement has been set is photographed to produce the correction value table. The relative measurement is conducted sequentially from the magnitude close to the magnitude at which the absolute measurement has been implemented. After the correction value table of the respective magnitudes has been produced, when the check bottom of "correction execution" is turned on, the scanning deflector control unit 17' or the image shift deflector control unit 16' is controlled on the basis of the correction value table to correct the geometric distortion.

In order to notify the geometric distortion measurement status, there is provided a function of displaying a mark on an icon of the magnification at which the geometric distortion is being measured in the window shown in FIGS. 10A to 10C (FIG. 10C). Also, there is provided a function of displaying a mark on the icon of the magnification at which the geometric distortion could not be measured (FIG. 10B). In the high magnification image, the microscopic structure included in the image is reduced, and the distortion analysis may be disenabled. The details of the measurement result are confirmed by opening the window shown in FIG. 11D.

Second Embodiment

Figure 13:
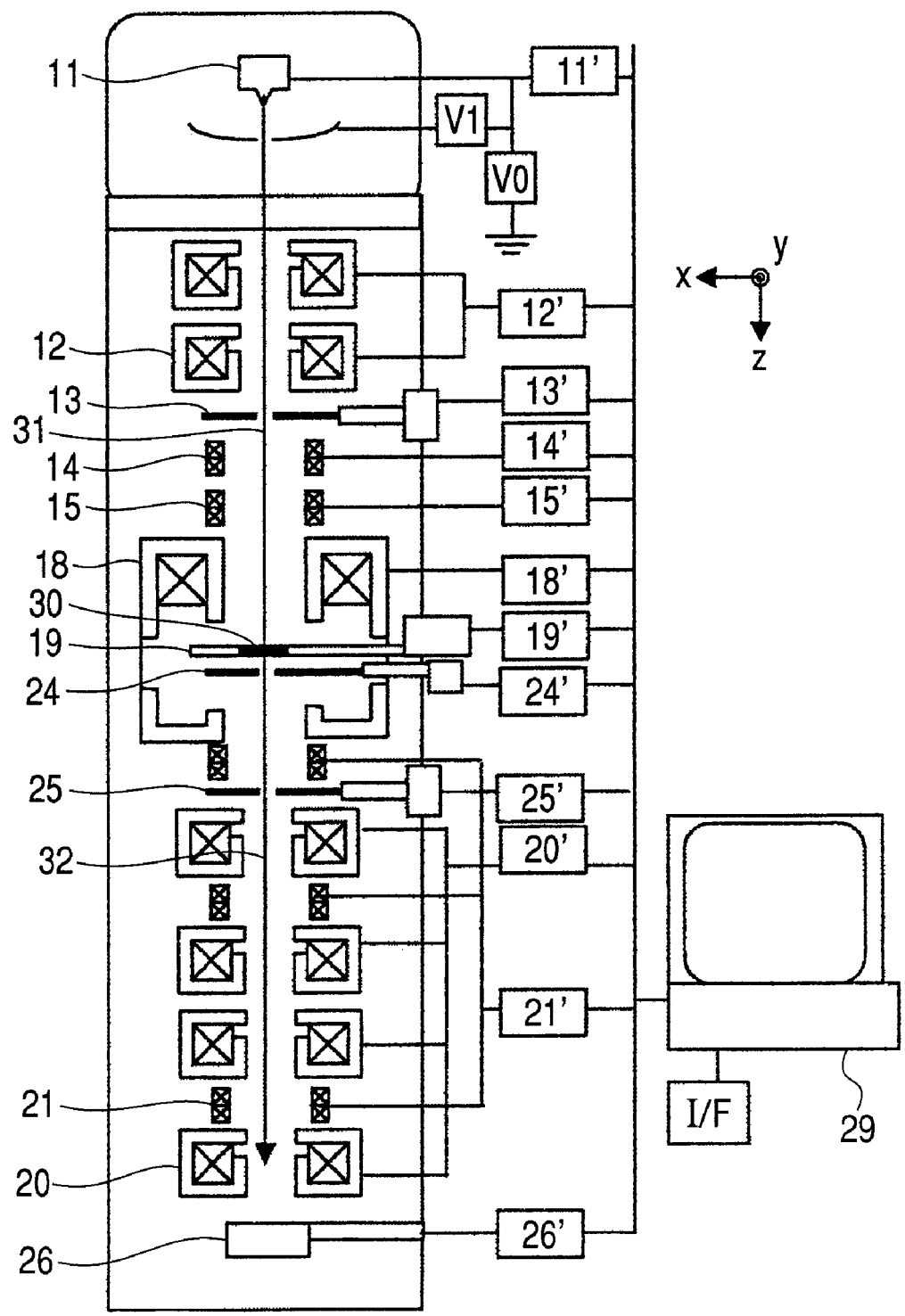
FIG. 13 is a diagram illustrating a basic structure of a TEM.

This embodiment shows a geometric distortion correcting technique in the TEM. FIG. 13 shows a basic structural diagram of a TEM used in this embodiment. The TEM includes an electron gun 11 that generates a primary electron beam 31, an electron gun control unit 11' that controls an acceleration voltage and an extraction voltage of the primary electron beam 31, a condenser lens 12 that adjusts the convergence conditions of the primary electron beam 31, a condenser lens control unit 12' that controls a current value of the condenser lens 12, a condenser aperture 13 that controls the spread angle of the primary electron beam 31, a condenser aperture control unit 13' that controls a position of the condenser aperture 13. The STEM/SEM also includes an alignment deflector 14 that controls an incident angle of the primary electron beam 31 that is input to a specimen 30, an alignment deflector control unit 14' that controls a current value of the alignment deflector 14, a stigmator 15 that adjusts the beam configuration of the primary electron beam 31 which is input to the specimen 30, and a stigmators control unit 15' that controls a current value of the stigmator 15. The STEM/SEM further includes an objective lens 18 that adjusts a focal position of the primary electron beam 31 on the specimen 30, an objective lens control unit 18' that controls a current value of the objective lens 18, a specimen stage 19 that sets the position of the specimen 30 within a specimen chamber, a specimen stage control unit 19' that controls a position of the specimen stage 19, a projective lens 20 that projects a transmission electron beam 32 that is transmitted through the specimen 30, a projective lens control circuit 20' that controls a current value of the projective lens 20, an electron detective camera 26 that detects the projected electron beam 32, an electron detective camera control unit 26' that controls the gain and offset of the electron detective camera 26, and a computer 29 that is equipped with TEM control software, and image processing software. The respective control units are controlled on command by the computer 29.

First, a description will be given of a process of obtaining the TEM image with reference to a device shown in FIG. 13. A primary electron beam 31 is extracted from the electron gun 11 by an extraction voltage V1, and an acceleration voltage V0 is applied to the primary electron beam 31. It is assumed that a direction that is substantially in parallel to the optical axis of a mirror body is a Z-direction, and a plane that is substantially orthogonal to the optical axis is an X-Y plane. A thinned specimen 30 is mounted on the specimen stage 19, and the primary electron beam 31 is input from a Z-direction. The primary electron beam 31 is so adjusted as to be input in parallel to the specimen with an input angle that is in parallel to the Z-axis by the aid of the condenser lens 12, the alignment deflector 13, and the stigmators 14. When the primary electron beam 31 is input to the thinned specimen 30, most of the electrons are transmitted through the specimen 30. The image surface of the transmission electron beam 32 is projected on the electron detective camera 26 by the aid of the projective lens 21 to obtain a TEM image. The magnification of the TEM image is set by the excitation current of the projective lens 21.

There is a case in which the TEM image is distorted by the distortion aberration of the projective lens. The geometric distortion of the TEM image can be measured through the geometric distortion measuring method described in the first embodiment. A difference between the TEM and the STEM resides in a geometric distortion correcting method. Since the TEM photographs an image with a camera, it is impossible to correct the geometric distortion in the same method as that of the STEM. One of the geometric distortion correcting methods in the TEM is a method of correcting the geometric distortion with a geometric distortion correction lens. The correction using the correction lens enables the correction in real time. As still another correcting method, there is a correcting method using image processing. The image that has been photographed with the electron detective camera 26 is geometrically converted by means of the computer 29. In the correction using the image processing, even a complicated distortion can be easily corrected. It is preferable that which correcting method should be selected is determined on the basis of the geometric distortion measurement results of the projective lens 21 or the level of skill of an operator. Other processes are substantially identical with those of the geometric distortion correction in the first embodiment.

Third Embodiment

Figure 14:
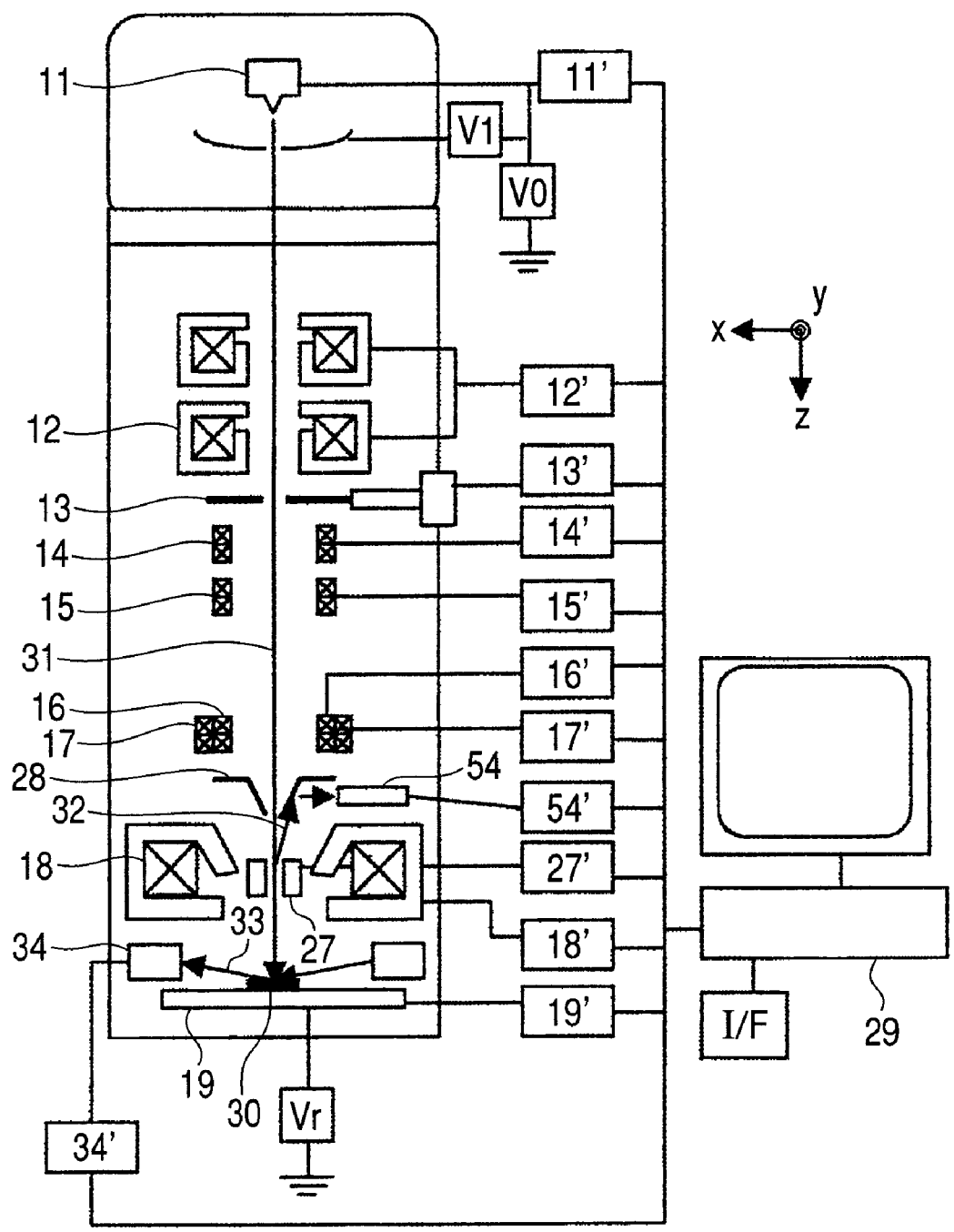
FIG. 14 is a diagram illustrating a basic structure of a wafer correspondence SEM.

This embodiment shows a geometric distortion correcting technique in the wafer correspondence SEM. The basis structural diagram of the wave correspondence SEM used in this embodiment is shown in FIG. 14. The SEM includes an electron gun 11 that generates a primary electron beam 31, an electron gun control unit 11' that controls an acceleration voltage and an extraction voltage of the primary electron beam 31, a condenser lens 12 that adjusts the convergence conditions of the primary electron beam 31, a condenser lens control unit 12' that controls a current value of the condenser lens 12, an alignment deflector 14 that adjusts an incident angle of the primary electron beam 31 that is input to a specimen 30, an alignment deflector control unit 14' that controls a current value of the alignment deflector 14, a stigmator 15 that adjusts the beam configuration of the primary electron beam 31 which is input to the specimen 30, and a stigmators control unit 15' that controls a current value of the stigmator 15. The SEM also includes an image shift deflector 16 that adjusts the irradiated area of the primary electron beam 31 which is input to the specimen 30, an image shift deflector control unit 16' that controls a current of the image shift deflector 16, a scanning deflector 17 which raster-scans the specimen 30 with the primary electron beam 31 which is input to the specimen 30, and a scanning deflector control unit 17' that controls a current of the scanning deflector. The SEM further includes an objective lens 18 that adjusts a focal position of the primary electron beam 31 on the specimen 30, an objective lens control unit 18' that controls a current value of the objective lens 18, a specimen stage 19 that sets the position of the specimen 30 within a specimen chamber, a specimen stage control unit 19' that controls a position of the specimen stage 19, an E×B deflector 27 that deflects the electrons 51 that are output from the surface of the specimen in a given direction, an E×B deflector control unit 27' that controls the current value of the E×B deflector 27, a converter electrode 28 that collides with the deflected electron beams, an electron detector 54 that detects the electron beam that is output from the converter electrode 28, an electron detector control unit 54' that controls the gain and offset of the electron detector 20, a height sensor 34 with a laser beam 33, a height sensor control unit 34 that controls the height sensor 34, and a computer 29 that is equipped with SEM control software and image processing software. The respective control units are controlled on command by the computer 29.

First, a process for obtaining the SEM image will be described. The primary electron beam 31 is extracted from the electron gun 11 by an extraction voltage V1, and an acceleration voltage V0 is applied to the primary electron beam 31. It is assumed that a direction that is in parallel to the optical axis of a mirror body is a Z-direction, and a plane that is substantially orthogonal to the optical axis is an X-Y plane. The specimen 30 is inserted into the SEM, and the height of the specimen 30 is obtained by the height sensor 34 with the laser beam, and the focal point of the objective lens 18 is focused on the specimen 30 by the Z-position adjustment of the specimen stage 19 or the control value adjustment of the objective lens 18. The adjustment is a coarse adjustment, and can provide precision to the image analysis enable degree. Also, the measurement of the focal distance can be implemented by the image processing. After the focal point has been coarsely adjusted, the viewing field for the electron optical system adjustment is selected by the aid of an X-Y transfer mechanism of the specimen stage 19. The axial displacement, the focal point, and astigmatism are corrected in the electron optical system adjustment viewing field. Then, the image is moved in the photograph viewing field by the aid of the specimen stage 19, and the focal point of the objective lens 18 is finely adjusted so that the image can be clearly observed, and thereafter the image is scanned.

In order to improve the space resolution, the recent wafer correspondence SEM is applied with a retarding electric field system (hereinafter referred to as "retarding") which increases an acceleration voltage at a primary side, and applies a negative voltage to the specimen side to retard the specimen input voltage. The negative voltage that is applied to the specimen side is called "retarding voltage Vr". In the CD-SEM that is used for the dimensional management of the semiconductor device, the retarding voltage is set so that the specimen input voltage approaches zero. In an electron beam wafer inspection system that detects the defect of a semiconductor device from a potential contrast, a retarding voltage Vr is adjusted depending on the device in order to produce a desired potential contrast. When the retarding voltage Vr changes, the magnification of the SEM image with respect to the specimen changes. When the retarding voltage has a distribution within the wafer surface, the SEM image magnification changes within the wafer surface. That is, the geometric distortion occurs. The geometric distortion is measured in the method described in the first embodiment, and corrected. The distribution of the retarding voltage Vr within the wafer surface depends on the specimen stage configuration. For that reason, it is necessary to update the correction value table according to the position of the specimen stage in the third embodiment.

Also, the recent wafer correspondence SEM is frequently customized for a specific inspection or measurement. The DR-SEM (defect review scanning electron microscope) is a device that detects the defective portion of the device on the basis of a difference image between a reference image and an input image. In this case, it is important to generate the undistorted image. This is because the pattern configuration changes depending on the position within the image in the distorted image, and therefore there is the possibility that a change in the pattern configuration which is attributable to the image distortion is misidentified as defective. On the other hand, in a device that measures the dimensions of a designated portion as in the CD-SEM, the generation of the undistorted image is not essential. This is because there is a method of correcting the length measurement result after the specimen configuration has been measured in the length by the aid of the distortion uncorrected image. The method of correcting the length measurement result is more effective than the method of implementing the distortion correction on the entire image. The generation of the undistorted image may be conducted only when the image is going to be observed in detail, for example, at the time of producing the recipe. It is better to set an object to be subjected to geometric distortion correction according to an intended purpose of inspection and measurement. Other processes are substantially identical with those of the geometric distortion correction in the first embodiment.

Fourth Embodiment

The geometric distortion correcting technique according to the present invention can be applied to not only the electron microscope but also another electric charged particle beam device. For example, the present invention can be applied to a focused ion beam (FIB) that finely converges an ion beam, raster-scans the specimen with the ion beam, and detects the electron beam or the secondary ion that is generated from the specimen to visualize the specimen structure. Also, the present invention can be applied to diverse probe microscopes, for example, a scanning tunnel microscopy (STM) or an atomic force microscopy (AFM).

What is claimed is:

1. An electric charged particle beam microscopy that irradiates a specimen with an electric charged particle beam, and detects the electric charged particle beam that is secondarily generated from the specimen to obtain an image of the specimen, the microcopy comprising:
    (a) a step of photographing a first specimen having a known structure at a first magnification, and measures an absolute distortion at the first magnification according to the obtained image;
    (b) a step of photographing a second specimen at the first magnification and a second magnification;
    (c) a step of measuring a relative distortion of the second magnification to the first magnification on the basis of the scaled image and the image obtained by photographing the second specimen at the second magnification;
    (d) a step of obtaining an absolute distortion of the second magnification on the basis of the absolute distortion of the first magnification and the relative distortion of the second magnification; and
    (e) a step of correcting the obtained absolute distortion of the second magnification.

2. The electric charged particle beam microscopy according to claim 1,
    wherein the first specimen is a lattice image having a known lattice surface interval.

3. The electric charged particle beam microscopy according to claim 1,
    wherein the relative distortion measurement includes: a step of photographing a viewing field including a common area to the image that has been photographed at the first magnification at the second magnification, a step of equally transforming the image of the first magnification to the second magnification to generate a scaled image, a step of obtaining a relative distortion between the scaled image and the image that has been photographed at the second magnification on the basis of the pattern matching result between the images.

4. The electric charged particle beam microscopy according to claim 1, further comprising:
    a step of obtaining an absolute distortion at an arbitrary magnification by repeating the steps (b) to (d) with the second magnification as the absolute distortion measured first magnification; and
    a step of correcting the absolute distortion at the respective magnifications.

5. An electric charged particle beam microscope, comprising:
    an electric charged particle source that generates a first electric charged particle beam;
    a first electromagnetic field generator that guides the first electric charged particle beam to a specimen;
    a specimen stage that sets a position of the specimen with respect to the first electric charged particle beam;
    a second electromagnetic field generator that guides a second electric charged particle beam that is output from the specimen to a detector;
    the detector that detects the second electric charged particle beam;
    an image forming unit that forms an image of a specimen structure on the basis of a detector output;
    a geometric distortion measuring unit that irradiates the first specimen having a known structure with the first electric charged particle beam, records the image photographed at a first magnification, measures an absolute distortion of the first magnification with respect to the first specimen, irradiates a second specimen with the first electric charged particle beam, records the image photographed at the first magnification and the image photographed at the second magnification, measures a relative distortion of the image at the second magnification with respect to the image of the first magnification on the basis of a pattern matching between the image of the second specimen photographed at the first magnification and the image of the second specimen photographed at the second magnification, and obtains an absolute distortion at the second magnification on the basis of the absolute distortion of the first specimen at the first magnification and the relative distortion of the second specimen at the second magnification with respect to the first magnification; and
    a correction unit that corrects the measured absolute distortion.

6. The electric charged particle beam microscope according to claim 5, further comprising a computer having the correcting unit therein.

7. The electric charged particle beam microscope according to claim 6, wherein the computer includes the geometric distortion measuring unit therein.

8. The electric charged particle beam microscope according to claim 5, wherein the first electromagnetic generator includes a deflector, and the correction unit controls the deflector on the basis of only the measured absolute distortion.

9. The electric charged particle beam microscope according to claim 5, wherein the second electromagnetic generator includes an electromagnetic field lens, and the correction unit controls the electromagnetic field lens on the basis of the measured absolute distortion.

10. The electric charged particle beam microscope according to claim 5, wherein the correction unit corrects a length measurement result that is obtained from an image formed by the image forming unit.

11. An electric charged particle beam microscope having an optical system that irradiates a specimen with an electric charged particle beam, a detector that detects a secondary electric charged particle beam that is produced by irradiating the specimen with the electric charged particle beam, and an image forming unit that forms an image on the basis of an output of the detector, the electric charged particle beam microscope comprising:

a memory that records an image photographed at a first magnification by irradiating a first specimen having a known structure with the electric charged particle beam therein; and a calculation unit that measures an absolute distortion with respect to the first specimen at the first magnification, wherein the memory records an image photographed at the first magnification and an image photographed at the second magnification by irradiating the second specimen with the electric charged particle beam, and wherein the calculation unit measures a relative distortion of the image at the second magnification with respect to the image at the first magnification on the basis of the image of the second specimen photographed at the first magnification and the image of the second specimen photographed at the second magnification, obtains the absolute distortion at the second magnification on the basis of the absolute distortion of the first specimen at the first magnification and the relative distortion of the second specimen at the second magnification with respect to the first magnification, and corrects the measured absolute distortion.

12. The electric charged particle beam microscope according to claim 11, wherein the optical system has a deflector that deflects the electric charged particle beam, and wherein the calculation unit controls the deflector so as to correct the measured absolute distortion.

13. The electric charged particle beam microscope according to claim 11, wherein an electromagnetic field lens is disposed between the detector and the specimen, and the calculation unit controls the electromagnetic field lens so as to correct the measured absolute distortion.

* * * * *